(12) United States Patent
Weller

(10) Patent No.: US 8,319,669 B2
(45) Date of Patent: Nov. 27, 2012

(54) TEXT ENTRY DEVICE WITH RADIAL KEYPAD LAYOUT

(76) Inventor: Jeffrey C Weller, Anderson, SC (US)

( * ) Notice: Subject to any disclaimer, the term of this patent is extended or adjusted under 35 U.S.C. 154(b) by 536 days.

(21) Appl. No.: 12/587,723

(22) Filed: Oct. 13, 2009

(65) Prior Publication Data

US 2010/0271241 A1    Oct. 28, 2010

Related U.S. Application Data

(60) Provisional application No. 61/214,303, filed on Apr. 22, 2009.

(51) Int. Cl.
*H03M 11/00*    (2006.01)
(52) U.S. Cl. .............................. 341/22; 341/20
(58) Field of Classification Search .................... 341/20, 341/22; 345/168; 400/486
See application file for complete search history.

(56) References Cited

U.S. PATENT DOCUMENTS

| | | | | |
|---|---|---|---|---|
| 4,876,415 A * | 10/1989 | Clancy | ........................ | 200/5 A |
| 5,332,322 A | 7/1994 | Gambaro | | |
| 5,397,189 A * | 3/1995 | Minogue | ..................... | 400/489 |
| 5,481,263 A | 1/1996 | Choi | | |
| 5,483,235 A | 1/1996 | Hanson et al. | | |
| 5,689,253 A * | 11/1997 | Hargreaves et al. | ............ | 341/22 |
| 5,774,384 A * | 6/1998 | Okaya et al. | ................... | 345/169 |
| D449,611 S | 10/2001 | Kendall | | |
| 6,543,947 B2 | 4/2003 | Lee | | |
| 6,567,072 B2 | 5/2003 | Watanabe | | |
| 6,657,560 B1 * | 12/2003 | Jung | .............................. | 341/22 |
| 6,698,952 B1 | 3/2004 | Goddard | | |
| 6,860,661 B1 * | 3/2005 | Daoud | ......................... | 400/488 |
| 7,113,111 B2 | 9/2006 | Tyneski et al. | | |
| D538,281 S | 3/2007 | Gambaro | | |
| 7,186,041 B2 | 3/2007 | Harley | | |
| 2006/0133881 A1 | 6/2006 | Osburn et al. | | |
| 2006/0294273 A1 | 12/2006 | Lee | | |
| 2009/0189864 A1 | 7/2009 | Walker | | |

FOREIGN PATENT DOCUMENTS

| | | |
|---|---|---|
| JP | 2000-010716 A | 1/2000 |
| JP | 2005-526303 A | 9/2005 |
| KR | 10-2006-0119527 A | 11/2006 |
| KR | 10-0855448 B1 | 9/2008 |

OTHER PUBLICATIONS

International Searching Authority: International Search Report and Written Opinion of the International Searching Authority; Publisher is Korean Intellectual Property Office; Seo-gu, Daejeon Republic of Korea; International Application No. PCT/US2010/002753; mailing date Aug. 2, 2011; (8 pages).

* cited by examiner

*Primary Examiner* — Brian Young
(74) *Attorney, Agent, or Firm* — Metz Lewis Brodman Must O'Keefe LLC; Neal P Pierotti

(57) ABSTRACT

A text entry device is provided. The device includes a concentric and at least four groupings of letters located around the concentric. The groupings may include at least three keys that are each located at a different radial distance from the concentric. The first grouping may include the letters A, B, C and D; the second grouping may include the letters E, F, G and H; the third grouping may include the letters I, J, K and L; and the fourth grouping may include the letters O, M, N and P.

20 Claims, 19 Drawing Sheets

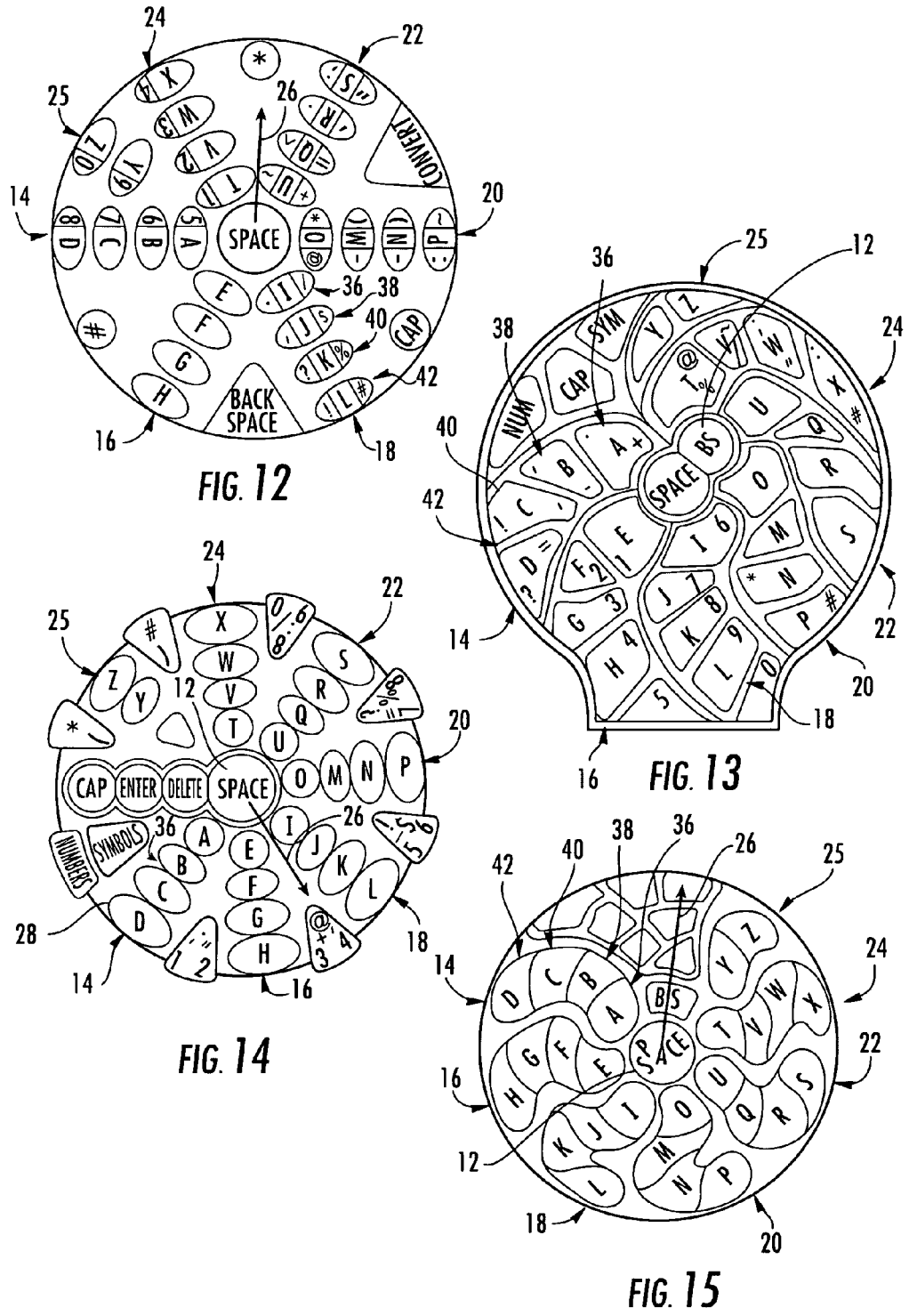

TEXT ENTRY DEVICE WITH RADIAL KEYPAD LAYOUT

CROSS REFERENCE TO RELATED APPLICATION

This application claims the benefit of U.S. Application Ser. No. 61/214,303 filed on Apr. 22, 2009 and entitled, "Multi-Feature Compact User Interface/Keypad." U.S. Application Ser. No. 61/214,303, is incorporated by reference herein in its entirety for all purposes.

FIELD OF THE INVENTION

The present invention relates generally to a text entry device for use in entering text by a user. More particularly, the present application involves a text entry device for thumb actuation in which letters are arranged thereon for optimum clarity and memory impact to achieve greater ease of use.

BACKGROUND

Text entry devices are known for use on electronic devices such as cell phones, gaming consoles, cameras, personal digital assistants, keypads, and remote controls. The sending and receiving of text messages is becoming a popular mode of communication and in certain age groups is in fact more preferred than voice communication. Text entry devices for these types of electronic devices employ one of two general formats.

An alpha-numeric layout is often used that generally includes ten numbered keys typically with three letters assigned to each key. Other keys may have more than three letters assigned thereto. The user will typically have to tap the key multiple times so that the desired character is registered in the device. Such alpha-numeric layouts typically require the user watch an input screen to ensure the data is entered correctly.

Another layout used with electronic devices is a QWERTY keypad which is a standard keyboard layout. Such a layout is familiar with the user due to its common usage in other applications and can thus be picked up on by the user with little difficulty. Each letter of the QWERTY layout is assigned its own key which increases the speed at which data can be entered. However, the keypad must be made in a reduced layout on certain electronic devices thus causing thumb and finger extension to be awkward and exceed natural movements. Entering of text on such reduced sized keypads is commonly done with the use of both thumbs. Further, the close proximity of the keys to one another causes inadvertent keys to be struck. As such, there remains room for variation and improvement in the art.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended Figs. in which:

FIG. 12 is a top view of a text entry device that includes multi-tap keys that have letters along with numbers and symbols.

FIG. 13 is a top view of a text entry device that has keys shaped and sized so as to receive a thumb print of the user upon actuating the keys from an at-rest position at the concentric.

FIG. 14 is a top view of a text entry device in which a single row of keys having letters is present.

FIG. 15 is a top view of a text entry device in which keys that are irregular in shape that extend in groupings that are irregular in shape are present.

Figure 1:
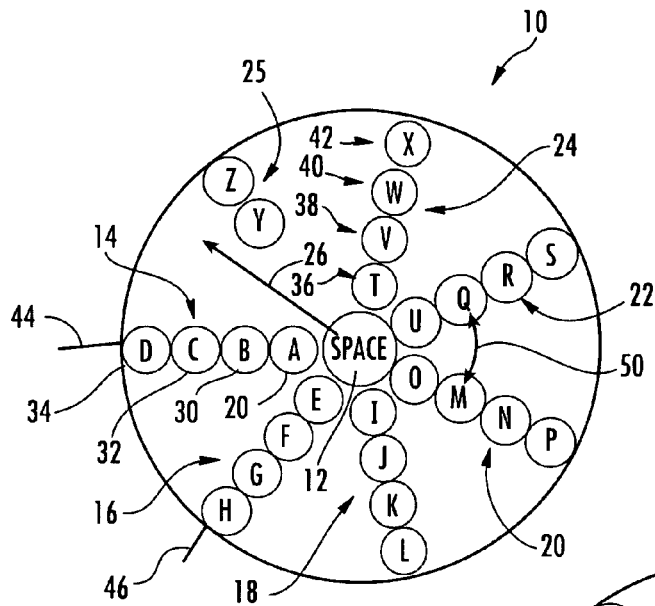
FIG. 1 is a top view of a text entry device in accordance with one exemplary embodiment.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

It is to be understood that the ranges mentioned herein include all ranges located within the prescribed range. As such, all ranges mentioned herein include all sub-ranges included in the mentioned ranges. For instance, a range from 100-200 also includes ranges from 110-150, 170-190, and 153-162. Further, all limits mentioned herein include all other limits included in the mentioned limits. For instance, a limit of up to 7 also includes a limit of up to 5, up to 3, and up to 4.5.

The present invention provides for a text entry device 10 that is arranged for improved text entry as compared to other devices. Although capable of being actuated by any number of fingers or thumbs of the user, the user may actuate all of the keys of the text entry device 10 through the use of a single thumb. The letters that are to be struck are arranged in such a fashion that the speed of inputting is increased versus standard QWERTY keyboard layouts. Additional embodiments are possible in which color is used to highlight and thus facilitate easier striking of certain keys of the text entry device 10. An additional aspect exists in the provision of a text entry device 10 that employs keys that have upper surfaces configured in a generally concave, bowl-like shape. Such an arrangement provides an ergonomic keypad layout and allows for improved text entry by the user.

One exemplary embodiment of the text entry device 10 is shown in FIG. 1. Here, the letters are arranged on keys such that a single key is devoted to a single letter. All of the letters of the alphabet are included. The layout of the text entry device 10 includes a concentric 12 which in this embodiment includes a key that is a space key. The concentric 12 may be the point from which the keys including the letters of the alphabet extend. The concentric 12 is shown in FIG. 1 as being the centrally located point of the keypad layout of the text entry device 10. However, it is to be understood that the concentric 12 need not be the centrally located point in other embodiments. As used herein, the concentric 12 is the location from which at least some of the disclosed groupings of letters extend, for example the first grouping 14, second grouping 16, third grouping 18, and fourth grouping 20. The concentric need not be a circular location or point but can be variously shaped in accordance with other exemplary embodiments.

The concentric 12 may include the space key since the space key is a commonly used key and the thumb of the user may be initially positioned at the concentric 12 upon grasping the text entry device 10. A first grouping 14 of letters extends in the radial direction 26 from the concentric 12 and is linearly arranged so that all of the keys of the first grouping 14 are at different radial distances from the concentric 12. The letters of the first grouping 14 from closest to farthest from the concentric 12 in the radial direction 26 are A, B, C and D in that order. As such, the letter A is closer to the concentric than the letter D. The letters of the first grouping 14 are located on individual keys 28, 30, 32 and 34 that are actuated by the user in order to cause the appropriate letter to be input into the text entry device 10. As shown, the letter A is on key 28, the letter B is on key 30, the letter C is on key 32, and the letter D is on key 34. Although described as being actuated by the thumb of the user, it is to be understood that the keys of the text entry device 10 may be actuated by both thumbs of the user, by fingers of the user, or any combination of thumbs and fingers in accordance with other exemplary embodiments.

The text entry device 10 also includes a second grouping 16 of letters that extends in a linear direction from the concentric 12. All of the letters of the second grouping 16 are at different radial distances from the concentric 12. The letters of the second grouping 16 from closest to farthest from the concentric 12 in the radial direction 26 are E, F, G and H in that order.

A third grouping 18 of letters is present and extends linearly from the concentric 12 so that each letter is located at a different radial distance from the concentric 12. The letters of the third grouping 18 from closest to farthest from the concentric 12 in the radial direction 26 are I, J, K and L in that order.

A fourth grouping 20 of letters is also included in the text entry device 10 and are likewise linearly arranged from the concentric 12 so that each letter is located a different radial distance from concentric 12. The letters of the fourth grouping 20 from closest to farthest from the concentric 12 in the radial direction 26 are O, M, N and P in that order.

A fifth grouping 22 is present and includes letters that extend linearly from the concentric 12 so that each letter is located a different radial distance therefrom. The fifth grouping 22 includes letters U, Q, R and S in that order that extend from closest to farthest from the concentric 12.

A sixth grouping 24 exists that includes letters that are linearly arranged extending from the concentric 12 so that each letter is located a different radial distance from the concentric 12. The letters of the sixth grouping 24 from closest to farthest from the concentric 12 in the radial direction 26 are T, V, W and X in that order.

A seventh grouping 25 is included and includes two letters that are likewise linearly arranged extending from the concentric 12. The seventh grouping 25 includes the letter Y which is closer to the concentric 12 than the letter Z which is farther from the concentric 12 in the radial direction 26. The letter Y is spaced the same distance from the concentric 12 as the letters C, G, K, N, R and W of the other groupings 14, 16, 18, 20, 22 and 24.

The groupings 14, 16, 18, 20, 22 and 24 include letters with single keys that are all linearly arranged from the concentric 12. The letters of the groupings 14, 16, 18, 20, 22 and 24 can all be spaced equally such that the first letters of the groupings 14, 16, 18, 20, 22 and 24 are all spaced an equal distance from the concentric 12, and so that the second letters are all spaced an equal distance from the concentric 12, and so forth. The groupings 14, 16, 18, 20, 22, 24 and 25 are distinguished from one another in that each one is located at a different angular position about the concentric 12. As such, all of the letters of the first grouping 14 have the same angular position 44 as one another but a different angular position than the letters in the other groupings 16, 18, 20, 22, 24 and 25. As shown for sake of example, the first grouping 14 has angular position 44 while the second grouping 16 has angular position 46 which is a different angular position. The groupings 14, 16, 18, 20, 22, 24 and 25 are also distinguished from one another as the letters of each individual grouping are immediately adjacent one another. Further, the groupings 14, 16, 18, 20, 22, 24 and 25 may be thought of as being arrays that extend from the concentric 12 such that the letters of the individual groupings 14, 16, 18, 20, 22, 24 and 25 extend along the array.

As used herein, the term "vowels" refers to the letters A, E, I, O and U. The term "consonants" refers to the remaining letters of the alphabet that are not vowels as previously defined. Groupings 20 and 22 may be separated an arc length 50 from one another. It is to be understood that the terms arc length and the distance in the angular direction are interchangeable with one another so far as they describe the position of a grouping or other object about the concentric 12.

The letters of the text entry device 10 are arranged so that a number of rows of letters are formed around the concentric 12. The rows may extend 360° around the concentric 12 so as to completely surround the concentric 12, or the rows may extend along an arc length that is less than 360° so that the concentric 12 is only partially surrounded with letters. As shown, a first row 36 is defined that includes the letters A, E, I, O, U and T that are all equally distant from the concentric 12 in the radial direction 26. A second row 38 is likewise defined that includes letters B, F, J, M, Q, and V that are all an equal distance from the concentric 12 in the radial direction 26. A third row 40 is present that includes letters C, G, K, N, R, W and Y that are all equally distant from the concentric 12 in the radial direction 26. Additionally, a fourth row 42 is present that includes the letters D, H, L, P, S, X and Z that are all an equal distance from the concentric 12 in the radial direction 26.

The rows 36, 38, 40 and 42 may be arranged so that letters of each row in consecutive angular position are not consecutive consonants of the alphabet. For example, the second row 30 includes letters B, F, J, M, Q and V in consecutive angular positions in that order. None of the consonants of the second row 30 are consecutive with another consonant in the immediately adjacent angular position. In this regard, letters of the alphabet are present between the letters B and F, letters of the alphabet are present between the letters F and J, and so forth. However, it is to be understood that other arrangements are possible in which one or more of the rows 36, 38, 40 and/or 42 have consecutive alphabetic consonants in immediately adjacent angular positions. In other arrangements, one of the rows 36, 38, 40 and 42 may have an instance of consecutive alphabetic consonants in immediately adjacent angular positions while the other rows 36, 38, 40 and 42 do not. In yet other arrangements, at least two of the rows 36, 38, 40 and 42 of the text entry device 10 do not have any consecutive alphabetic consonants in immediately adjacent angular positions. The vowels may be placed in consecutive order of appearance in the alphabet in row 36 extending angularly around the concentric 12. Although shown alphabetically as progressing in a counterclockwise direction, the letters of the text entry device 10 can be arranged in other embodiments so that they progress in a clockwise direction about the concentric 12. The groupings 14, 16, 18, 20, 22, 24 and 25 may be positioned at angular positions about the concentric 12 so that they are equally spaced from immediately adjacent groupings 14, 16, 18, 20, 22, 24 and 25 such that their arc length from one to the next is the same. Alternatively, the groupings 14, 16, 18, 20, 22, 24 and 25 can be located so that they are at different arc lengths from immediately adjacent groupings 14, 16, 18, 20, 22, 24 and 25 about the concentric 12.

The letters can be arranged symmetrically or asymmetrically about the concentric 12. The arrangement of FIG. 1 can be modified in accordance with other exemplary embodiments. For example, in one arrangement the sixth grouping 24 can be provided so that the letters Y, T, V and W in that order extend in the radial direction 26 from the concentric 12 so that each letter of the sixth grouping 24 is located at a different radial distance from concentric 12. The seventh grouping 25 can be modified so that the letter Y is replaced with the letter X. In another exemplary embodiment of the text entry device 10, the arrangement of FIG. 1 can be modified so that the sixth grouping 24 includes three letters T, V and W in that order that extend in the radial direction 26 from the concentric 12. The seventh grouping 25 includes the letters X, Y and Z in that order that extend in the radial direction 26 from the concentric 12. The sixth and seventh groupings 24 and 25 may start radially immediately adjacent the concentric 12 or may be spaced from the concentric 12 so that the farthest letter of each grouping 24 and 25 is on the outer perimeter of the keypad layout.

The groupings of letters and their arrangement may allow for faster entry to be made by the user of the text entry device 10 and may result in less errors being made thus increasing the efficiency of the entry.

Figure 2:
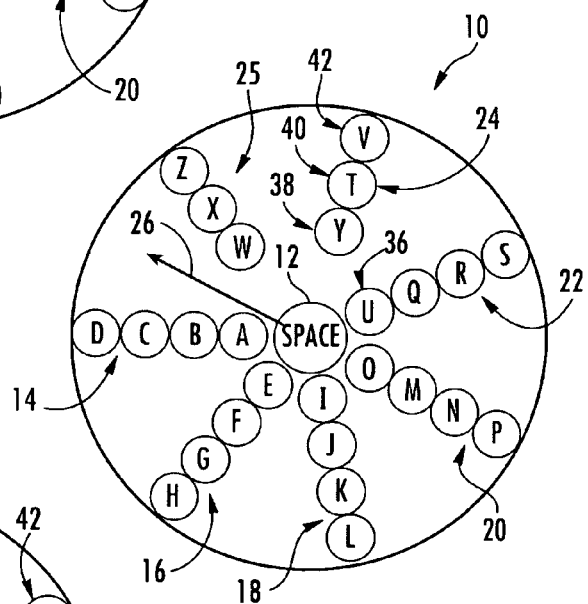
FIG. 2 is a top view of a text entry device similar to FIG. 1 in which the fifth and sixth grouping of letters are arranged differently.

Another exemplary embodiment of the text entry device 10 is illustrated in FIG. 2. The keypad layout of FIG. 2 is substantially similar to that of FIG. 1. However, the sixth grouping 24 includes the letters Y, T and V in that order that extend in the radial direction 26 from the concentric 12 so that each letter of the sixth grouping 24 is located at a different radial distance from the concentric 12. The seventh grouping 25 is also different in that it includes three letters that are W, X and Z that extend in that order in the radial direction 26 from the concentric 12 and again are linearly arranged so that they are each located at a different radial distance from concentric 12.

Figure 3:
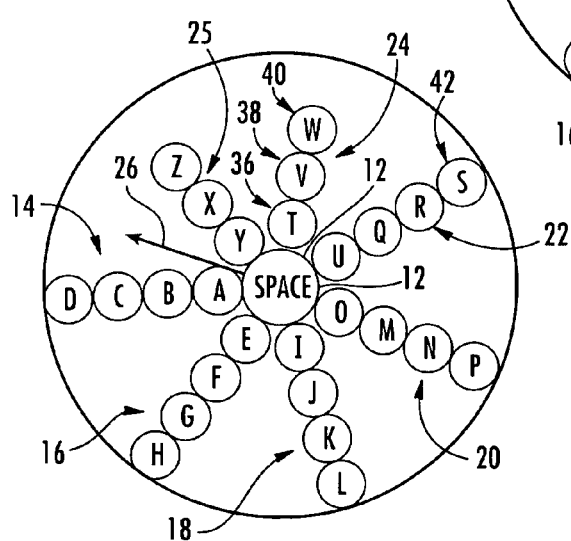
FIG. 3 is a top view of a text entry device similar to FIG. 1 in which the fifth and sixth groupings of letters are arranged differently.

Another arrangement of the text entry device 10 is shown in FIG. 3 that is similar to that of FIG. 1. However, the sixth grouping 24 is different in that it is only three letters long with the letters T, V and W in that order that extend in the radial direction 26 from the concentric 12. The seventh grouping 25 is likewise different and includes three letters Y, X and Z in that order that extend in the radial direction 26 from the concentric 12. Both the sixth and seventh groupings 24 and 25 begin immediately adjacent the concentric 12 so that the letters T and Y are in the first row 36, the letters V and X are in the second row 38, and the letters W and Z are in the third row 38. Again, the letters in each of the rows 36, 38, 40 and 42 are located the same distance from one another in the radial direction 26 from the concentric 12.

Although shown as being circular in shape, the keys 28 of the text entry device 10 can be variously shaped in accordance with other embodiments. Further, the letters can be arranged so that the letters of the groupings 14, 16, 18, 20, 22, 24 and 25 all extend in a linear manner from the concentric 12 and are located symmetrically or asymmetrically about the concentric 12. In this regard, the groupings 14, 16, 18, 20, 22, 24 and 25 can be arranged so that there is a gap between adjacent groupings 14, 16, 18, 20, 22, 24 and 25 in angular direction that is larger than the angular distance between other adjacent groupings 14, 16, 18, 20, 22, 24 and 25. This gap may be used by the user as a tactile reference aid or may include other keys of the text entry device 10 such as number 72, symbol 74, function 76, or back space 78 keys. Other gaps may also be present between other adjacent groupings 14, 16, 18, 20, 22, 24 and 25 so that these gaps are larger than those between the remaining adjacent groupings 14, 16, 18, 20, 22, 24 and 25 that may be exploited in a similar manner. In accordance with another exemplary embodiment, the seventh grouping 25 may include the Y and Z letters and may not be linearly arranged with respect to the concentric 12. Here, the seventh grouping 25 may merely be located adjacent the outer two letters of the sixth grouping 24 and thus offset from the concentric 12 and not linearly arranged therewith in the radial direction 26.

Figure 4:
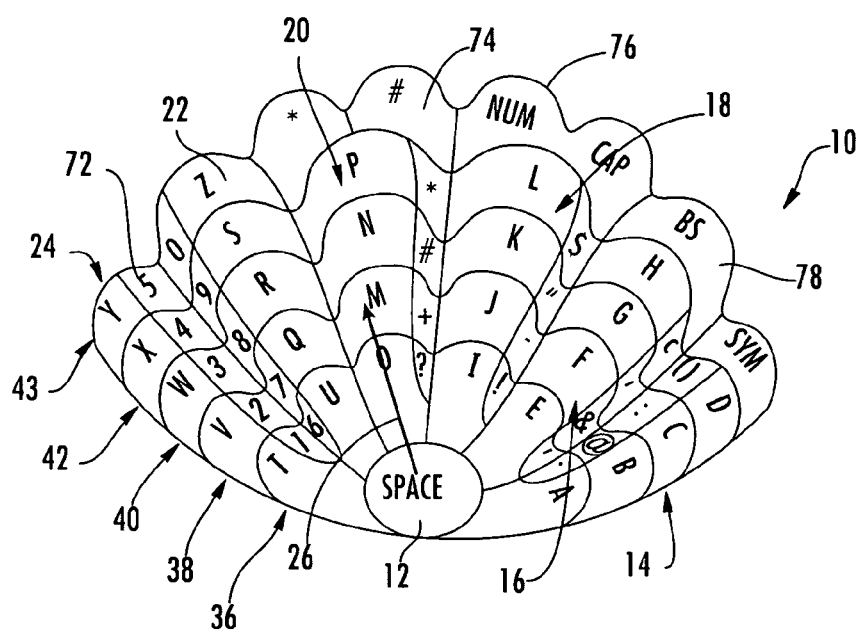
FIG. 4 is a top view of a text entry device in accordance with another exemplary embodiment in which all of the letters extend less than 180° about the concentric.

FIG. 4 shows an alternative exemplary embodiment of the text entry device 10. The concentric 12 includes the space button but is not located at the center of the keypad but rather on the bottom edge. However, letters of the text entry device 10 all extend from the concentric 12. The first grouping 14 includes the letters A, B, C and D in that order that extend from the concentric 12 in the radial direction 26. The second, third and fourth groupings 16, 18 and 20 are arranged in an order previously discussed. The fifth grouping 22 includes the letters U, Q, R, S and Z in that order from the concentric 12 in the radial direction 26. Further, the seventh grouping 24 includes the letters T, V, W, X and Y in that order from the concentric 12. A fifth row 43 is present that includes the letters Y and Z. The letters are thus arranged around generally less than 180° of the concentric 12, and are not present upon at least an arc length of 180° about the concentric 12. Number keys 72 are located between the sixth and seventh groupings 24 and 25. The number keys 72 including the numbers 1-5 are on a single multi-tap key, and the number keys including the numbers 6-0 are on a second multi-tap key. Symbol keys 74 are located between groupings 18 and 20, between groupings 16 and 18, and between groupings 14 and 16 and are located at the outer edge of the text entry device 10 remote from the concentric 12. Function keys 76 and a backspace key 78 may also be included and are located at locations farther from the concentric 12 in the radial direction 26 than groupings 14, 16 and 18. Symbol keys 74 including the symbols ?, +, #, *, # and * are on a single multi-tap key. Symbol keys including the symbols !, :, ", $, CAP, and NUM are on a single multi-tap key. Symbol keys 74 including the symbols ",", &, ', c, and BS are on a single multi-tap key. Symbol keys including the symbols ., @, :, ( ), and SYM are on a single multi-tap key. The letter keys of the embodiment may be single tap keys. However, it is to be understood that the arrangement in FIG. 4 can be varied in other embodiments so that any combination of single or multi-tap keys can be employed.

Figure 5:
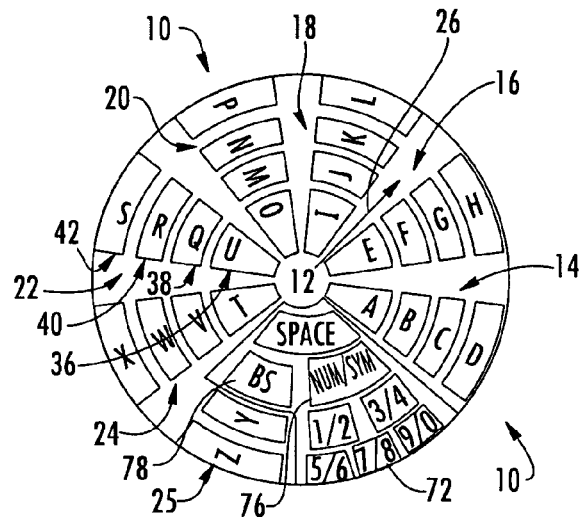
FIG. 5 is a top view of a text entry device in which the concentric does not include a key in accordance with another exemplary embodiment.

An alternative exemplary embodiment of the text entry device 10 is shown in FIG. 5 in which the concentric 12 does not include a space key. In this embodiment, the concentric 12 does not include any keys. The groupings 14, 16, 18, 20, 22, 24 and 25 are arranged as generally described with other previous embodiments. A larger gap is present between the first grouping 14 and the sixth grouping 24 into which the space key and other keys 72, 76 and 78 may be located. These additional keys can be located around the seventh grouping 25 which includes the letters Y and Z. The number keys 72 may be multi-tap keys in which more than one number are assigned to a single key. In this regard, one tap of the key 72 may register the first number while the second tap of the key 72 may register the second number. In accordance with other exemplary embodiments, the number keys 72 may include a single key for each number so that each number has its own key 72. Additional keys may be spaced between the groupings 14, 16, 18, 20, 22, 24 and 25 or they may be only located in the gap formed between the sixth and seventh grouping 24 and 25 and the first grouping 14. In yet other embodiments, an additional large gap may be present between the third and fourth groupings 18 and 20 into which additional non-letter keys can be located. As such, the groupings 14, 16 and 18 can be immediately adjacent to one another and separated from groupings 20, 22 and 24 by way of a pair of gaps that include non-letter keys. In such an arrangement, the groupings 14, 16 and 18 may be on the left side of the layout, and the groupings 20, 22, and 24 (that includes X and Z in the fourth row) may be on the right side of the layout. The pair of gaps may be arranged between the left side and the right side of the layout with one gap at the top of the layout and the other gap at the bottom of the layout with the concentric 12 between. The gap may be filled with non-letter keys and the pair of gaps, and left and right sides of the layout may be symmetrically formed.

Figure 6:
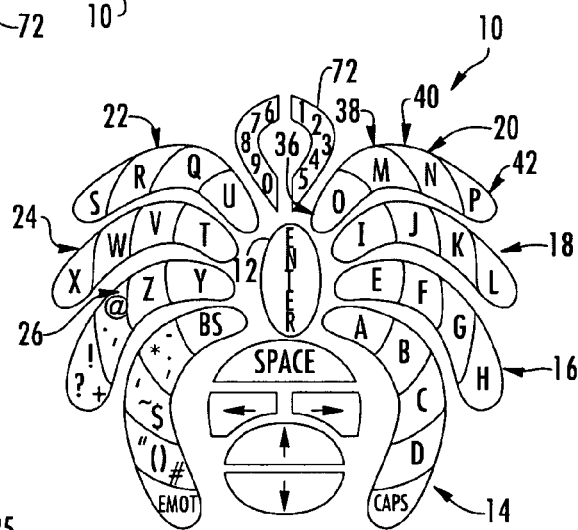
FIG. 6 is a top view of a text entry device in which the letters are configured into the shape of a spider.

The text entry device 10 can be arranged so that the keys are in the shape of a spider or other animal or object. FIG. 6 illustrates one such embodiment in which the groupings 14, 16, 18, 20, 22, 24 and 25 extend from a concentric 12 that includes an enter key. The groupings 14, 16, 18, 20, 22, 24 and 25 make up the legs of the spider and sequential keys are each farther from the concentric 12 so that none of the individual keys of each one of the groupings 14, 16, 18, 20, 22, 24 and 25 is located the same distance from the concentric. The letters Y and Z may be located in the first row 36 and the second row 38 respectively.

Figure 7:
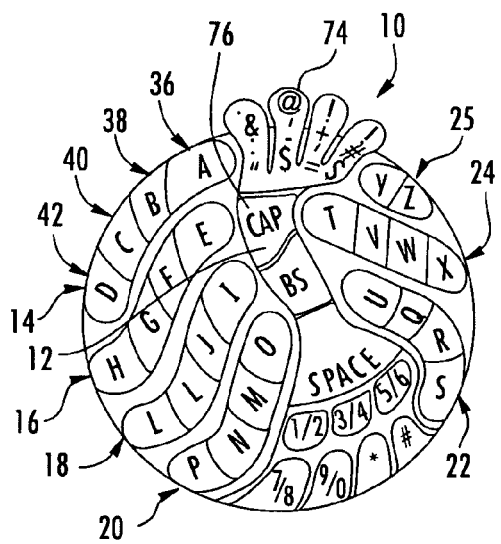
FIG. 7 is a top view of a text entry device in which the letters extend from a concentric that includes symbols, a function key, and a back space key.

FIG. 7 illustrates another exemplary embodiment that again includes groupings 14, 16, 18, 20, 22, and 24 that extend from a concentric 12 that includes a caps key, a back space key and various symbol keys. The Y and Z letters are located in the first row 36 and the second row 38 respectively.

Figure 8:
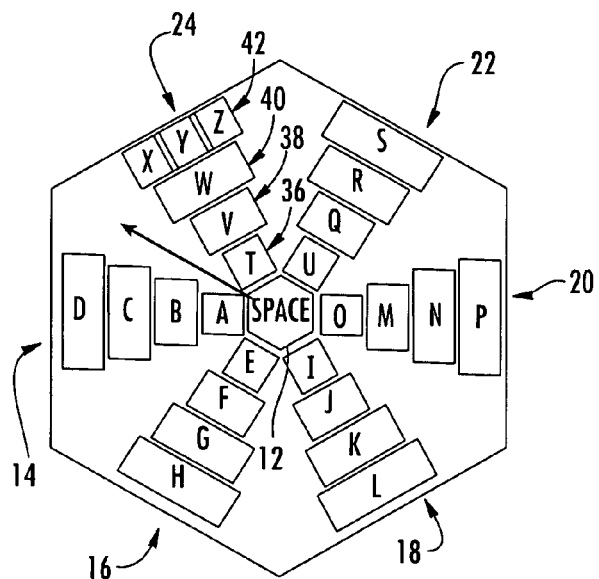
FIG. 8 is top view of a text entry device in accordance with another exemplary embodiment.

FIG. 8 shows an exemplary embodiment similar to FIG. 1 as the groupings 14, 16, 18, 20 and 22 are identical with the exception of the shape of the keys and the angular positions are slightly off. However, a seventh grouping 25 is not present and the sixth grouping 24 includes the letters T, V and W in that order extending from the concentric 12 in the radial direction 26. The letters X, Y and Z are all located radially beyond the letter W and are disposed in the fourth row 42. The letters X, Y and Z are each assigned their own key. However, other embodiments are possible in which a single key is assigned to the letters X, Y and Z so that the single key is a multi-tap key in which the number of taps to the key determine which letter X, Y or Z registers on the text entry device 10. In yet other embodiments, the letter X is assigned to its own single key while the letters Y and Z share a key that is again a multi-tap key.

Figure 9:
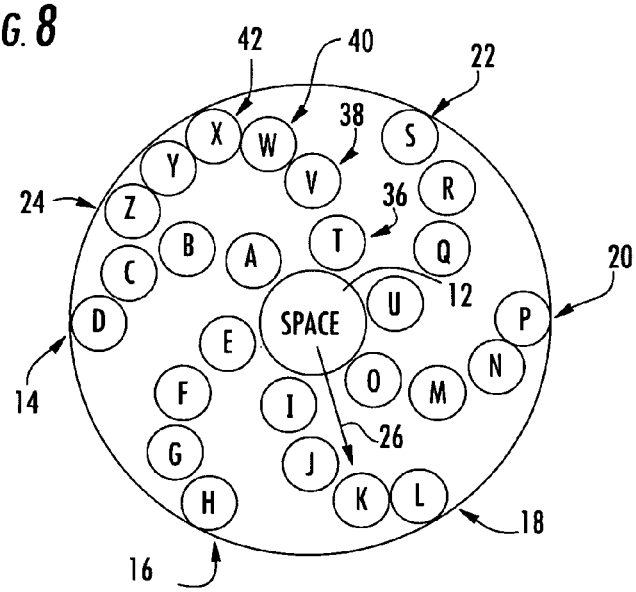
FIG. 9 is a top view of a text entry device in which the groupings extend in a spiral configuration from the concentric.

The text entry device 10 can be fashioned as illustrated in FIG. 9 in which the groupings 14, 16, 18, 20, 22, and 24 do not extend linearly from the concentric 12 but rather are arranged in a spiral manner so that each letter is consecutively farther from the concentric 12 along the particular grouping. As with the embodiment in FIG. 8, the letters X, Y and Z are in the fourth row 42 and are each located along the outer perimeter of the text entry device 10.

Figure 10:
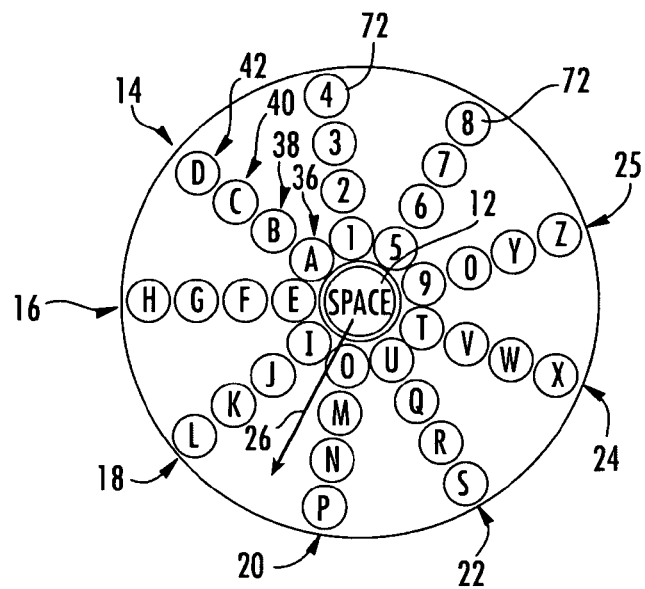
FIG. 10 is a top view of a text entry device in accordance with another exemplary embodiment.

FIG. 10 discloses another exemplary embodiment in which the groupings 14, 16, 18, 20, 22, 24 and 25 are arranged as disclosed with previous embodiments. Number keys 72 can be included in order to fill in the seventh grouping 25 and to define two additional pairs of groupings that in effect fill in the gap present between the first grouping 14 and seventh grouping 25 so that a symmetric text entry device 10 is provided. In another exemplary embodiment, the number keys 72 can be removed, or replaced with other types of keys, and the letter keys may remain.

Figure 11:
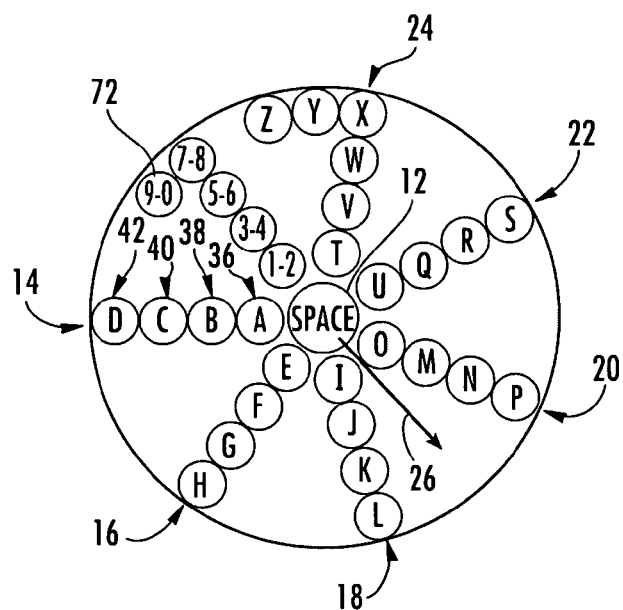
FIG. 11 is a top view of a text entry device in accordance with another exemplary embodiment.

The text entry device 10 of FIG. 11 includes groupings 14, 16, 18, 20 and 22 as previously discussed. Grouping 24 includes letters T, V, W, X, Y and Z in which the letters X, Y and Z are in the fourth row 42. A grouping of multi-tap number keys 72 are located in a gap between the first grouping 14 and the sixth grouping 24. Other exemplary embodiments exist in which an additional grouping of multi-tap symbol keys 74 are likewise located between the groupings 14 and 24 and are arranged with the grouping of number keys 72 so that a generally symmetric arrangement of keys of the text entry device 10 is realized.

FIG. 12 is an exemplary embodiment of the text entry device 10 similar to FIG. 1. However, certain keys are multi-tap keys and include a letter and a number, or include a letter and multiple symbols. A conversion key may be used to obtain desired input from the multi-tap keys, or the multi-tap key may be struck a number of times to achieve the desired text entry. Generally multi-tap keys that have combinations of numbers and symbols actuate the number upon the first tap and the symbols on successive taps, however a conversion key may be first actuated so that strikes on the multi-tap key yield symbols when first struck.

FIG. 13 illustrates an exemplary embodiment of the text entry device 10 in which the keys are shaped differently from one another and are shaped and arranged so as to capture the thumb-print of the user upon being displaced from the concentric 12 during use. The concentric 12 includes a space key and a back space key. The user will generally keep his or her thumb over the concentric 12 in an at rest position. When striking the keys, the user will move his or her thumb some distance from the concentric 12. The size of the portion of his or her thumb striking a particular key will depend upon its location from the concentric 12. As such, the keys may be sized and shaped so as to capture the thumb print of the user upon being displaced from the concentric 12. Four rows 36, 38, 40 and 42 are present and extend in an irregular path about the concentric 12. Letters in the third or fourth rows 40 and 42 may be located at the perimeter although this is not always the case for every letter. The letters Y and Z are located in the third row 40 and the fourth row 42 respectively. Also, the letters in the groupings 14, 16, 18, 20, 22, 24 and 25 do not extend linearly from the concentric 12 but are arranged so that each consecutive letter of a particular grouping is located at a farther distance from the concentric 12.

The keys of the text entry device 10 may be variously shaped in accordance with different exemplary embodiments. For example, the keys may be hemispherically shaped, cylindrically shaped and oriented vertically, cylindrically shaped and oriented horizontally, elliptically shaped, or bar shaped that are straight, curved or angled. Further, the keys may be in the shape of a square, rectangle, triangle, trapezoid, parallelogram, or circle in accordance with various exemplary embodiments.

FIG. 14 illustrates an embodiment in which all of the letters are located on only rows 36 of keys that are immediately adjacent one another. In this regard, the keys are separate keys so that only one key is actuated at a time.

The exemplary embodiment of FIG. 15 includes groupings 14, 16, 18, 20, 22, 24 and 25 that extend in irregular paths from the concentric 12. Additionally, the keys are irregular in shape, and a gap is formed between the first grouping 14 and the seventh grouping 25 into which various keys that are non-letters may be placed as desired.

Figure 16:
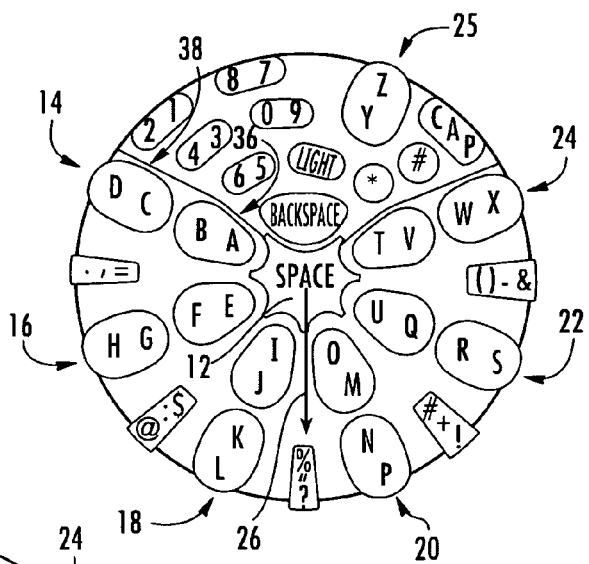
FIG. 16 is a top view of a text entry device in which multi-tap keys are present and two rows of keys with letters exist.

FIG. 16 is an exemplary embodiment in which each grouping 14, 16, 18, 20, 22 and 24 includes two keys that are each multi-tap keys. The keys of the first row 36 include the two letters that are located closest to the concentric 12 in the exemplary embodiment of FIG. 1, and the keys of the second row 38 include the two letters that are located farthest from the concentric 12 in the exemplary embodiment of FIG. 1. A single tap of key 28 may cause an A to be registered while a double tap will cause a B to be registered. A single tap of key 30 may cause a C to be registered while a double tap actuates a D. As such, the order of the letter listed on the key with respect to the concentric 12 may be instructive as to how many taps are needed. Grouping 25 includes a single multi-tap key for letters Y and Z and is arranged in the second row 38 on the perimeter of the text entry device 10.

Figure 17:
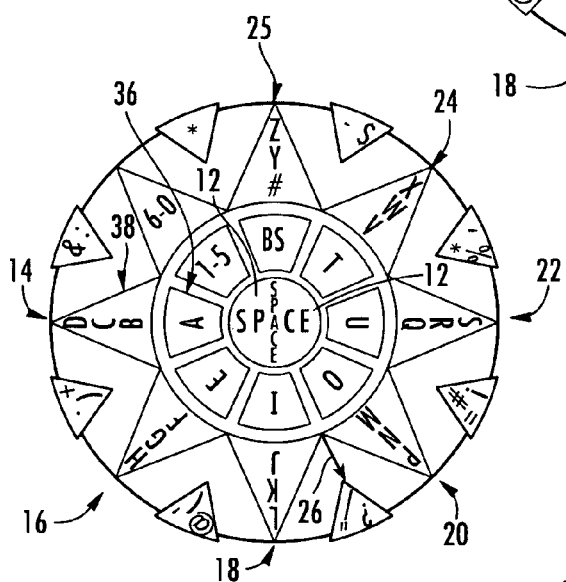
FIG. 17 is a top view of a text entry device in which the first row includes letters assigned to a single key and in which the second row includes letters assigned to multi-tap keys.

FIG. 17 illustrates another exemplary embodiment of the text entry device 10 in which a pair of rows 36 and 38 are present. The first row 36 includes the vowels A, E, I, O and U and the consonant T. The keys of the first row 36 are single tap such that each letter is assigned its own key. The second row 38 includes multi-tap keys to capture the rest of the letters of the alphabet. Each grouping 14, 16, 18, 20, 22, 24 and 25 includes only one multi-tap key so that three letters are assigned to each key. The grouping 25 is an exception in that only two letters, Y and Z, are used although a symbol may also be included as well so that it includes three characters thereon. Number keys 72 also arranged into the first and second rows 36 and 38 can be included and can be between the first grouping 14 and seventh grouping 25 and may be multi-tap keys.

Figure 18:
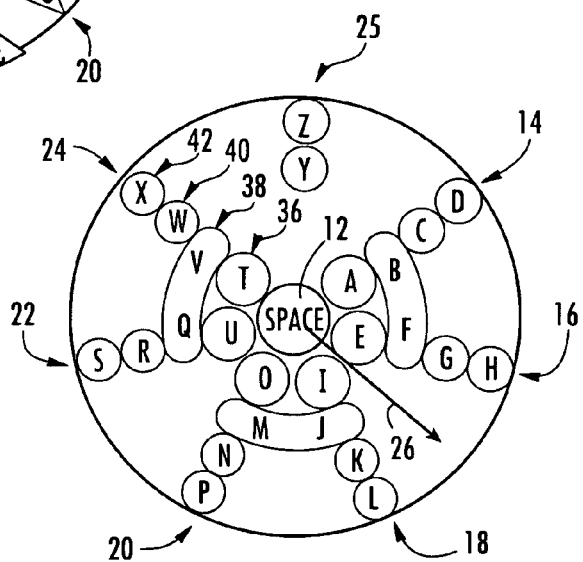
FIG. 18 is a top view of a text entry device in which multi-tap keys span adjacent groupings of letters.

Another exemplary embodiment is shown in FIG. 18 in which multi-tap keys that span adjacent groupings are used. The multi-tap keys are located in the second row 38. In this regard, the letter B of the first grouping 14 shares a key with the letter F of the second grouping 16. Actuation of this multi-tap key a single time may cause the B letter to be registered and actuation a second time may cause the F letter to be registered as B is before F in the alphabet. The other two multi-tap keys may be similarly arranged. An enter key or a timed auto-enter feature may be incorporated into the text entry device 10 when multi-tap keys are used. In accordance with another exemplary embodiment, the groupings 14, 16, 18, 20, 22, 24 and 25 can have their own multi-tap keys. For example, the letters A and D of the first grouping 14 may each have their own key while the letters B and C share a multi-tap key. The other groupings 16, 18, 20, 22 and 24 may be arranged in a similar manner in which only their first and last letters are located on a single key. The letters Y and Z may be located on a single multi-tap key in this exemplary embodiment.

Figure 19:
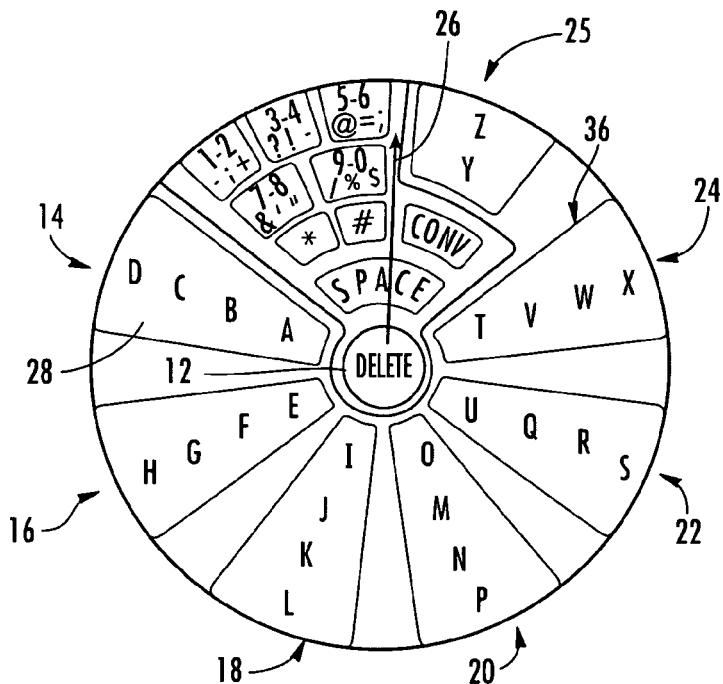
FIG. 19 is a top view of a text entry device in which each grouping of letters is assigned a single multi-tap key.

FIG. 19 shows an exemplary embodiment in which a single row of keys 36 is present and are multi-tap keys. All four letters A, B, C and D are actuated by use of the single key 28. The letters Y and Z are included on a multi-tap key that functions as a double tap key. Non-letter keys may be included in a gap between the first grouping 14 and the sixth and seventh groupings 24 and 25 and may or may not be multi-tap keys.

Figure 20:
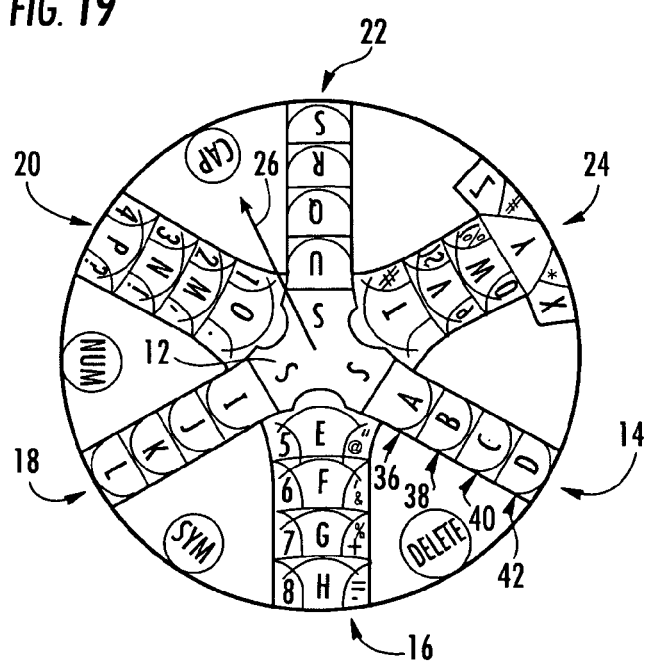
FIG. 20 is a top view of a text entry device in accordance with another exemplary embodiment.

FIG. 20 illustrates an exemplary embodiment in which multi-tap keys are used that include both letters, numbers and symbols. Such an arrangement was previously disclosed with reference to FIG. 12, and a conversion key may be actuated in order to cause a particular multi-tap key to generate a particular letter, number or symbol as listed thereon. Additionally or alternatively, a conversion key need not be used and instead the generated character may be based upon the number of times the multi-tap key is struck.

Figure 21:
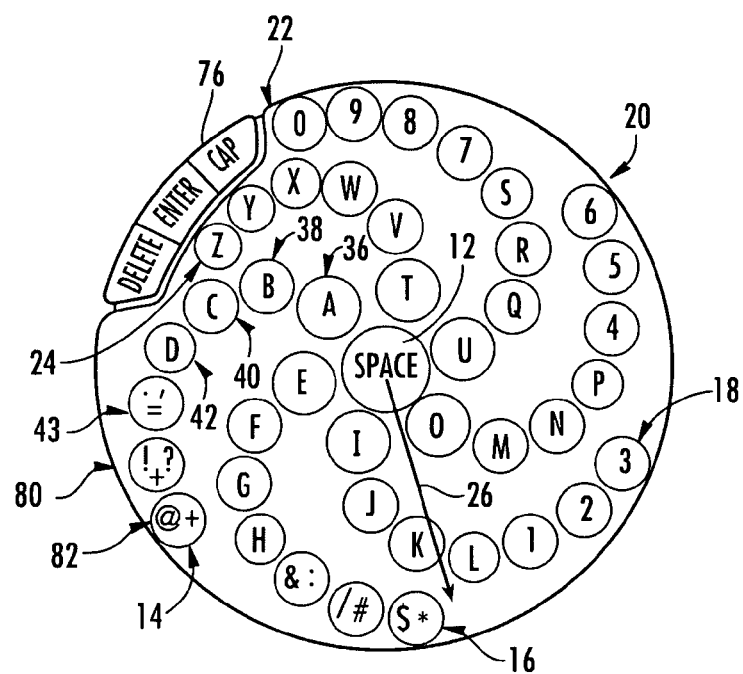
FIG. 21 is a top view of a text entry device in which the groupings are spirally arranged and in which a seventh row of keys is present.

FIG. 21 illustrates an alternative exemplary embodiment of the text entry device 10 in which the groupings 14, 16, 18, 20, 22 and 24 are spirally arranged about the concentric 12. Any number of rows may be used in accordance with various exemplary embodiments. For example, the groupings 14, 16, 18, 20, 22 and 24 may be extended up to seven rows. The first grouping 14 includes letters arranged as in previous exemplary embodiments. However, a fifth row 43 is present that is farther from the concentric 12 along the first grouping 14 and includes a multi-tap symbol key. A sixth row 80 located next in distance from the concentric 12 from the fifth row 43 is present and includes a multi-tap key that features symbols. A seventh row 82 is included and has a multi-tap key that is farther from the concentric 12 than the sixth row 80 along the grouping 14. The fifth grouping 22 includes seven rows in which the numbers 9 and 0 are both located in the seventh row 82 and are positioned along the perimeter of the text entry device 10. Additional function keys 76 can be arranged along the perimeter. As with other exemplary embodiments, the consecutive letters along the groupings 14, 16, 18, 20, 22 and 24 are generally farther from the concentric 12 in the radial direction 26 although this may not be the case with every letter due to the spiral nature of the groupings 14, 16, 18, 20, 22 and 24 in embodiments that include this feature.

Figure 22:
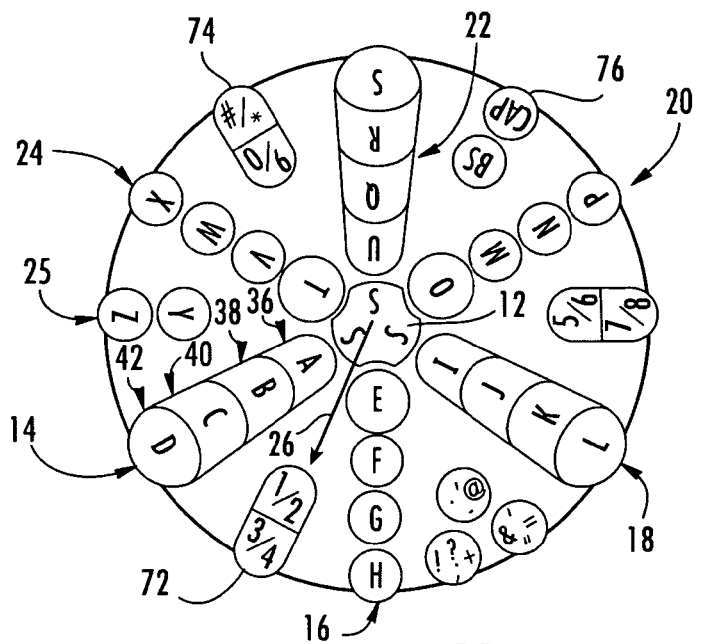
FIG. 22 is a top view of a text entry device in which groupings alternating in the angular direction have different key shapes.

The exemplary embodiment of FIG. 22 includes groupings 14, 16, 18, 20, 22, 24 and 25 that are arranged so as to extend linearly from the concentric 12 with each letter of the groupings 14, 16, 18, 20, 22, 24 and 25 being spaced a different distance in the radial direction 26 from the concentric 12. The first grouping 14, third grouping 18, and fifth grouping 22 have keys that engage one another while the alternate groupings 16, 20, 24 and 25 have keys that are distinct from one another. Number keys 72, symbol keys 74, and function keys 76 extend from the perimeter of the text entry device 10 towards the concentric 12 between the various groupings 14, 16, 18, 20, 22, 24 and 25 as shown in FIG. 22.

The exemplary embodiment of FIG. 22 may also use color to help the user distinguish between groupings 14, 16, 18, 20, 22, 24. For example, primary and secondary colors may be used and each grouping 14, 16, 18, 20, 22, 24 may be provided in a different color. In this regard, primary and secondary colors may alternate around the layout in the circumferential direction. The first grouping 14 may be a primary color, the second grouping 16 may be a secondary color, the third grouping 18 may be a primary color and so forth. In one arrangement, all of the keys of grouping 14 are blue, all of the keys of grouping 16 are green, all of the keys of grouping 18 are yellow, all of the keys of grouping 20 are purple, all of the keys of grouping 22 are red, and all of the keys of grouping 24 are orange. In a different version, the grouping 24 may be purple and the grouping 20 may be orange so that the placement of all of the secondary colors are all between two primary colors that form the secondary colors. The grouping 25 and all of the other keys may be of the same color such as black, white or gray. The concentric 12 may be black or brown.

Figure 23:
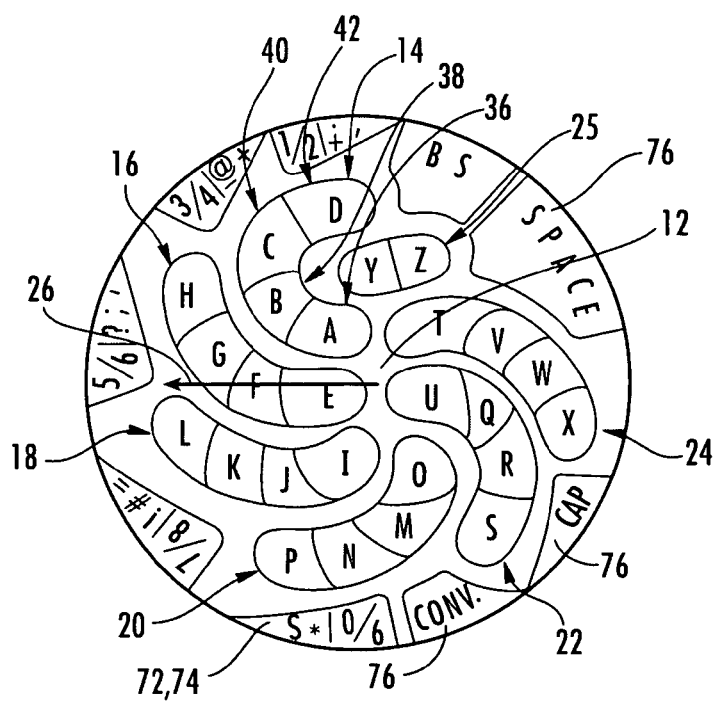
FIG. 23 is a top view of a text entry device in which the groupings have irregular shapes and key shapes.

The exemplary embodiment of FIG. 23 includes a concentric 12 that does not have a key and groupings 14, 16, 18, 20, 22, 24 and 25 that extend in curved arrangements from the concentric 12. Each letter of the individual groupings 14, 16, 18, 20, 22, 24 and 25 is located a different distance from the concentric 12 in the radial direction 26. Four rows 36, 38, 40 and 42 are present such that each one of the letters in the groupings 14, 16, 18, 20, 22, and 24 is located in a different one of the rows 36, 38, 40 and 42 depending upon their consecutive distance from the concentric 12. The letters Y and Z may be located in the third row 40 and fourth row 42 respectively. All of the other non-letter keys are located at the perimeter. Certain keys are multi-tap such as the combined number keys 72 and symbol keys 74, while other keys such as the illustrated function keys 76 are single assigned.

The concentric 12 can be either symmetrical or asymmetrical in shape. The concentric 12 in FIG. 23 is asymmetrical and extends from the base of the Y key to the base of the O key. As such, the concentric 12 need not be a single point but can be elongated and may extend along any portion of the keypad surface of the device.

Figure 24:
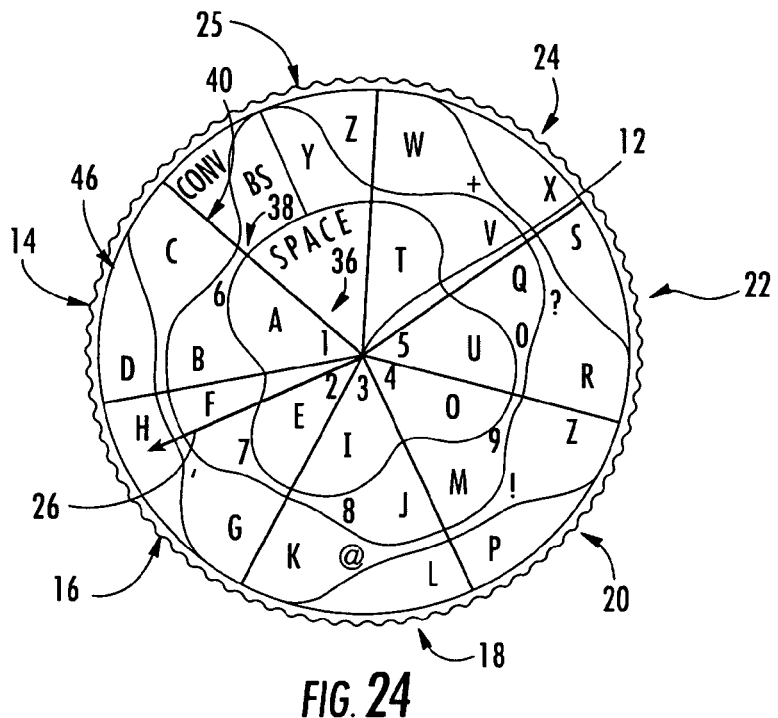
FIG. 24 is a top view of a text entry device with keys arranged in a pie like configuration.

Another exemplary embodiment of the text entry device 10 is shown in FIG. 24 in which the keys are divided up into sections that are pie shaped and the same size. The letters on the fourth row 42 are located at the perimeter. Certain keys are multi-tap, and certain keys that are non-letter keys are single assigned. The letters Y and Z are in the third and fourth rows 40 and 42 respectively.

Figure 25:
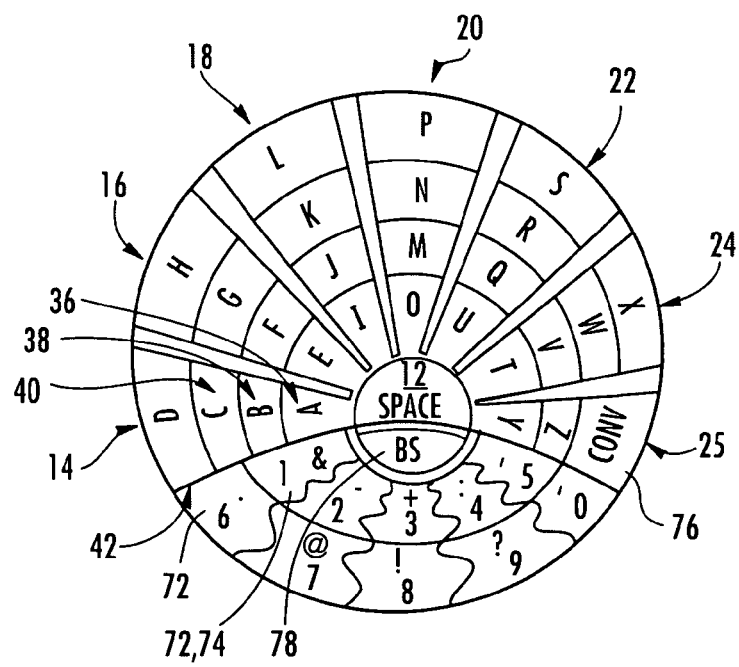
FIG. 25 is a top view of a text entry device with keys arranged in a sunrise configuration.

The text entry device 10 can be arranged so that the keys are arranged to form various items. FIG. 25 is one example in which the keys are arranged in the form of a sunrise. The groupings 14, 16, 18, 20, 22, 24 and 25 are shaped and sized so as to be rays of the sun, non-letter keys 72, 74 and 76 are shaped and sized so as to be reflections off of water, and the concentric space key 12 is shaped and sized to be the sun rising over a body of water. A gap is thus made in the angular direction between grouping 14 and grouping 25 into which the non-letter keys 72, 74 and 76 are disposed. Other arrangements of the text entry device 10 are possible in which the keys are arranged to be in the shape of a spider web, eagle, hawk, palm tree, or other object or animal. The keys may be arranged in the likeness of a person, plant, celestial body, machine, building, structure, logo, ascot, hobbies, club, religion, event, or holiday in other exemplary embodiments.

Figure 26:
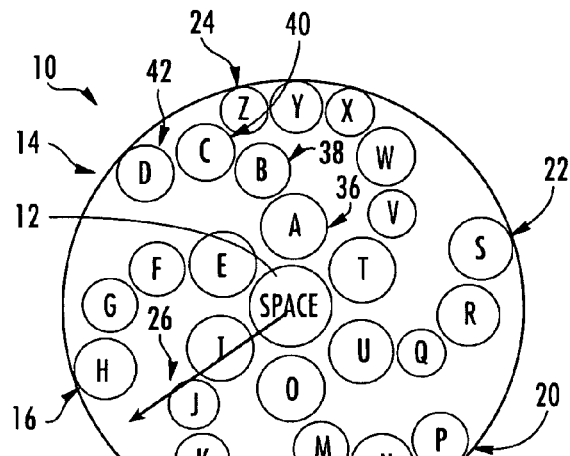
FIG. 26 is a top view of a text entry device in which in the keys containing the letters are sized based upon letter frequency usage.

FIG. 26 illustrates an alternative exemplary embodiment in which the groupings 14, 16, 18, 20, 22, and 24 are spiral in shape, as other embodiments, and in which certain letters are on keys that are larger than the keys onto which other letters are located. The letters of the first row 36 are sized so that none of the other letters are larger. The letters can be sized so that more frequently used letters are larger than those that are less frequently used. For example, the keys having the letters V, Q and X are smaller than the keys having the letters L, N and P. The keys may be grouped into any number of groups of size based on usage. The other previously discussed embodiments in which the keys are shaped and sized based on thumb or finger print may also be provided so that the frequency of usage of the letters on the keys is taken into account when sizing the keys. In other embodiments, the size and shape of the key is selected based upon the usage frequency of the letter included with the key.

Figure 27:
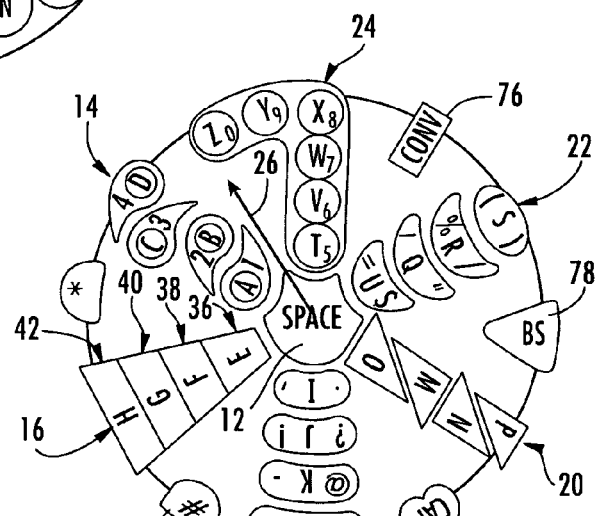
FIG. 27 is a top view of a text entry device in which each grouping of letters has keys with unique shapes.

The exemplary embodiment in FIG. 27 includes groupings 14, 16, 18, 20, 22, and 24 that each have keys that are differently shaped from one another. In this regard, the groupings 14, 16, 18, 20, 22, 24 and 25 have keys with unique shapes and sizes. The use of different shaped keys for each grouping 14, 16, 18, 20, 22, 24 and 25 may allow the user to more easily identify a desired key by way of tactile sensation without having to look at the text entry device 10.

Color may also be used to allow the user to more easily distinguish keys in groupings 14, 16, 18, 20, 22, 24 and 25 from one another. For example, the keys of each grouping 14, 16, 18, 20, 22, 24 and 25 may be assigned a different color so that they are more easily distinguishable from one another. In accordance with one exemplary embodiment, the primary colors of red, blue and yellow are used on alternating groupings 14, 16, 18, 20, 22, 24 and 25 in the angular direction about the concentric 12. Secondary colors are used for the groupings 14, 16, 18, 20, 22, 24 and 25 between those that have primary colors. For example, in one exemplary embodiment grouping 14 is red, grouping 18 is blue, and grouping 22 is yellow. Those between groupings 14, 18 and 22 are made of secondary colors such that grouping 16 is green, grouping 20 is purple, and grouping 24 is orange.

Figure 28:
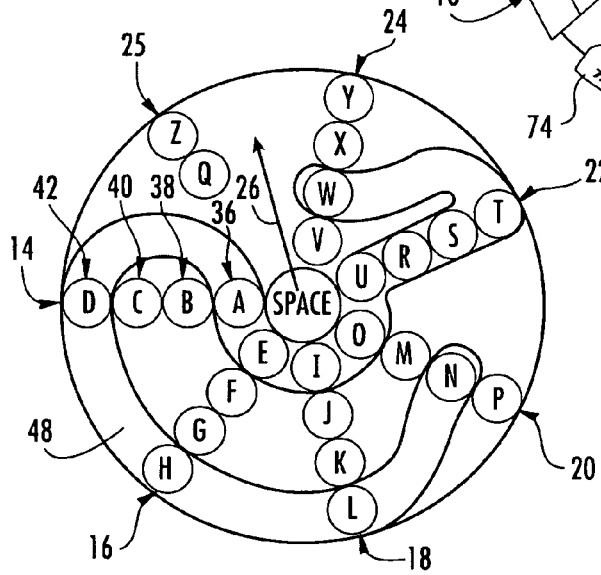
FIG. 28 is a top view of a text entry device in which a color weave is used to distinguish certain letters.

FIG. 28 shows another exemplary embodiment in which color is used to distinguish certain letters. The letters chosen for being accentuated by color may be those letters more commonly used when entering text. A color weave 48 is present on the text entry device 10 and features one or more colors that function to draw attention to those letters within the color weave 48. Those letters outside of the color weave 48 are associated with less pronounced coloring such as black, white, gray, or cream so that the user notices a distinction between the letters found within the color weave 48, which may be primary colors, and those outside of the color weave 48. The color weave 48 may include the portion of the text entry device 10 that surrounds the letters on the base of the keypad, commonly known as the keybed, or may form part of the keys onto which the letters are located. The color weave 48 may be customizable by the user. In this regard, the user can place or arrange the color weave 48 so that it is associated with letters or numbers the user desires. As such, the letters shown in FIG. 28 in association with the color weave 48 are only exemplary and others are possible in accordance with other embodiments.

The color weave 48 can be a ribbon or tape that is printed or painted, molded into, or applied to the surface upon which the keys having the letters are mounted. The color weave 48 may take a variety of shapes. For instance, the color weave 48 can be circular in nature and surround letters on keys that are likewise circular in nature. The color weave 48 may highlight the ten most frequently used letters in accordance with one embodiment. Although shown as being continuous, the color weave 48 may be made of several separate segments and can transition from being bright colors associated with the most commonly used letters to colors of lesser brightness of letters less frequently used. In accordance with one exemplary embodiment, primary colors are used in the color weave 48 to highlight vowels and the letter T while secondary colors are used for other less commonly used consonants which may be the letters D, H, L and N. The letters found within the color weave 48 may be the letters A, D, H, L, N, E, I, O, U, R, S, T, and W and may extend between different groupings 14, 16, 18, 20, 22, 24 and 25.

Figure 29:
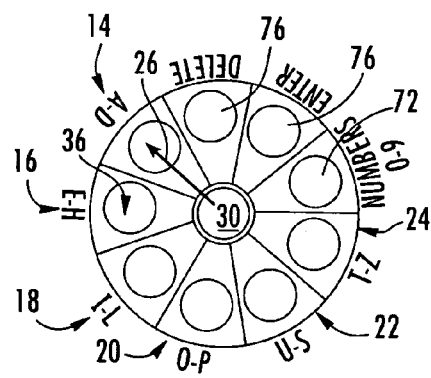
FIG. 29 is a top view of a text entry device that is micro-sized.

The text entry device 10 may also be arranged in a micro-size format with keys that can be actuated through the use of a pen or pencil tip, a stylus, or bent paper clip. The text entry device 10 may have a diameter that is from 5/16" to 3/8" in one exemplary embodiment. In accordance with another exemplary embodiment, the diameter of the text entry device 10 may be up to 1/8". FIG. 29 illustrates an exemplary embodiment of the text entry device 10 when used in micro size. A space key is located at the concentric 12, and multi-tap keys are used in the groupings 14, 16, 18, 20, 22 and 24 due to size constraints as single keys for single letters may be difficult to actuate. The letters are all thus found within a single row 36 and the keys themselves are not numbered but rather the area adjacent the keys to inform the user of the input upon actuating a particular key. Color and/or division lines may be used to distinguish the groupings 14, 16, 18, 20, 22, and 24 from one another.

Figure 30:
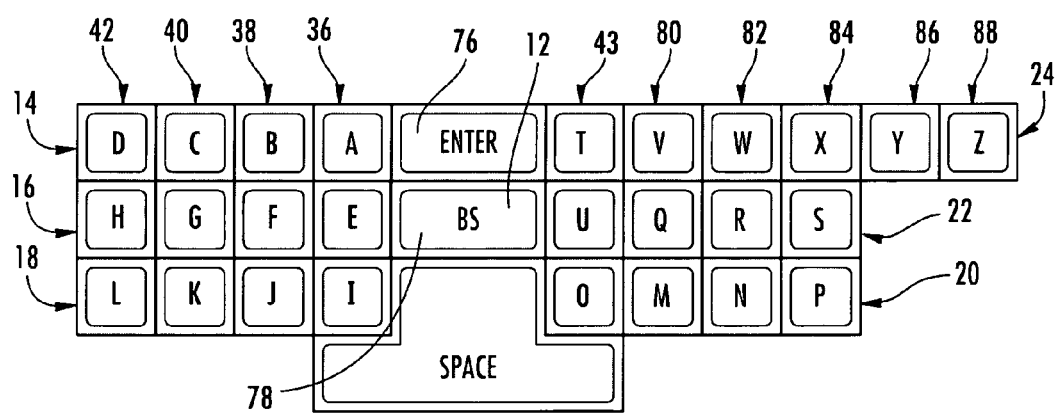
FIG. 30 is a top view of a text entry device in which the groupings extend linearly but not in an angular direction from the concentric.

An alternative exemplary embodiment is illustrated in FIG. 30 in which the concentric 12 includes an enter key, a backspace key 78, and a space key. The letters extend linearly from the concentric 12 but are not disposed in an angular fashion about the concentric. Each letter of each of the groupings 14, 16, 18, 20, 22 and 24 is located a farther distance away from the concentric than the adjacent letter of that grouping 14, 16, 18, 20, 22 and 24. An eighth row 84 is present that includes letters X, S and P. A ninth row 86 includes the letter Y and a tenth row 88 includes the letter Z. The letters in each row 36, 38, 40, 42, 43, 80, 82, 84, 86, and 88 are all equally distant from the concentric 12 as the other letters of that particular row 36, 38, 40, 42, 43, 80, 82, 84, 86, and 88 if any.

Figure 31:
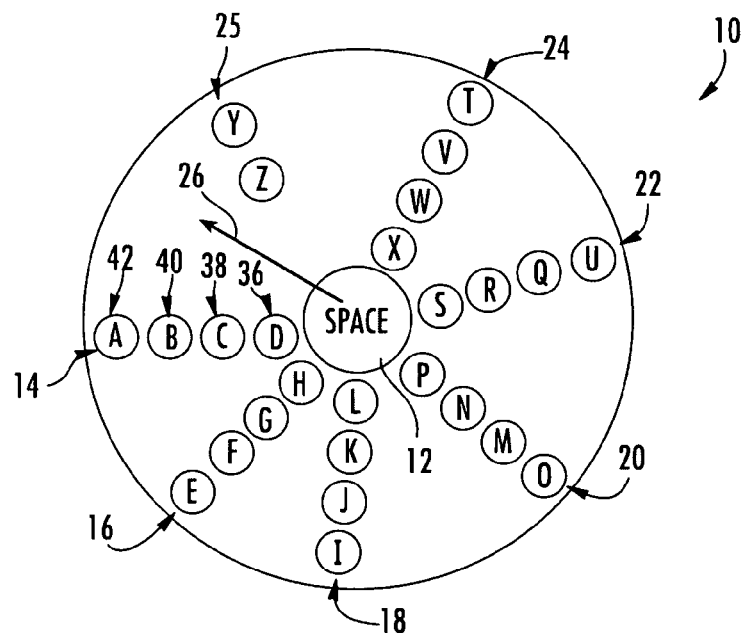
FIG. 31 is a top view of a text entry device in which none of the vowels are located closer to the concentric than any of the consonants.

FIG. 31 illustrates an alternative exemplary embodiment that is the same as that described in relation to FIG. 1, but in which all of the letters are reversed in their order in the radial direction 26 from that shown in FIG. 1. For example, the letters D, C, B and A in that order extend from closest to the concentric 12 to farthest from the concentric 12 in the radial direction 26. The vowels are thus arranged on the outer perimeter of the text entry device 10 and none of the vowels are located closer to the concentric 12 than any of the consonants. However, the consonant T is located the same distance from the concentric 12 as the vowels.

Figure 32:
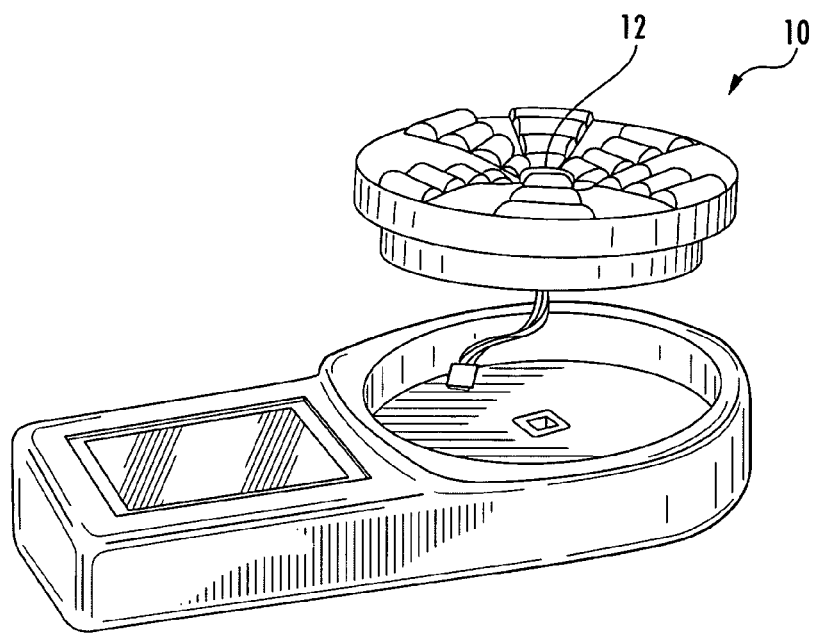
FIG. 32 is a perspective view of a text entry device in accordance with another exemplary embodiment.

The text entry device 10 may be arranged into a unit so that a keybed 92, keys, sensors and support electronics are housed into a rounded or angled unit that resembles a disc. The text entry device 10 can be connected to a host device 90 as illustrated in FIG. 32. Communication to the host device 90 can be effected through the use of a wire with a plug, pins or blades, a USB port, or a wireless connection. A flexible data transfer tape or strip with a plug on one end as illustrated in FIG. 32 can also be used. The text entry device 10 can be rotatable, removable, and replaceable with respect to the host device 90. The host device 90 can have a cavity that is shaped to receive the text entry device 10 and into which the text entry device 10 can be disposed and retained. Any suitable connection can be used to attach the text entry device 10 to the host device 90 such as by means of snaps, screws, pins, blades, friction, or mechanical fasteners. As stated, the text entry device 10 can be rotated with respect to the host device 90 to satisfy user preference. The rotation ability of the text entry device 10 may be achieved by the user picking up and manually rotating the text entry device 10 and then placing the text entry device 10 into communication with the host device 90 through engagement of the plug, pins or blades, USB port, wireless connection, or flexible data strip. The text entry device 10 may thus be swapped for another to be then inserted into the host device 90 in order to allow for use with different applications, user preferences, or in a training type mode in which more advanced text entry device 10 layouts are used as the user gains familiarity with more basic text entry device 10 layouts. The user may move from a strong functional visual text entry device 10 and once becoming proficient with same, may change to a more tactile based text entry device 10 for no-look texting. The text entry device 10 may also be changed to achieve different designs, themes or colors as desired. The host device 90 may be any electronic device that needs text entry. The host device 90 may be a cell phone, computer mouse, camera, gaming console, GPS device, language translator, PDA, portable keyboard, remote control, or a key fob in accordance with certain exemplary embodiments.

Figure 33:
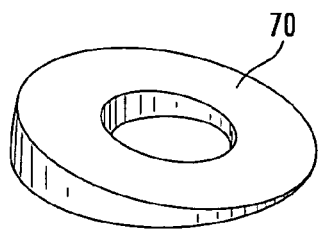
FIG. 33 is a perspective view of a wedge.

An angled wedge 70 as shown in FIG. 33 can be included and may be placed between the text entry device 10 and the host device 90. The angled wedge 70 changes the orientation of the keys of the text entry device 10 as presented to the user when utilized so that greater user comfort is realized. The user may remove the angled wedge 70 if desired to thus change back the angular relationship of the keys. The wedge 70 can likewise be rotated with respect to the host device 90 so that the angle of inclination realized by the text entry device 10 is likewise rotated as per user preference. The wedge 70 may be a completely separate component from the text entry device 10 or may be formed integrally therewith so that they form a single, non-detachable component. In one embodiment, five different wedges 70 can be provided to the user so that the user may select one of these wedges 70 to use to achieve a desired angle of inclination.

Figure 34:
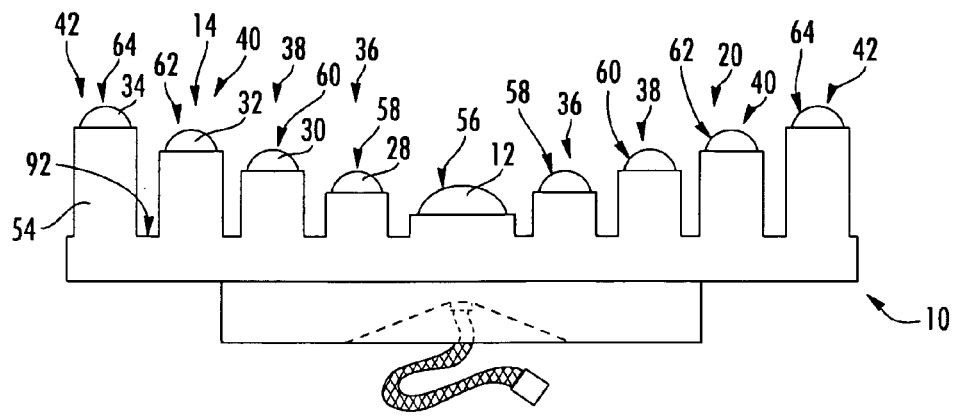
FIG. 34 is a side view of a text entry device with keys that have convex shaped surfaces with groupings arranged in a concave shape.

In accordance with certain exemplary embodiments, the text entry device 10 can be in the shape of a concave bowl. In this regard, the first row 36 may have a height that is lower than the second row 38. FIG. 34 shows an exemplary embodiment in which the letters are located on keys that have curved upper surfaces. The upper surfaces 58 of the keys of the first row 28, which are shown in FIG. 33 as including the first grouping 14 and the fourth grouping 20, are located at a height from the keybed 92 that is lower than the height of the upper surfaces 60 of the keys of the second row 38. The upper surfaces 58 are higher than the upper surface 56 of the concentric 12. The upper surfaces 62 of the keys of the third row 40 are higher than the upper surfaces 60 of the second row 38. Additionally, the upper surfaces 64 of the keys of the fourth row 42 are higher than the upper surfaces 62 of the keys of the third row 40. Collars 54 may extend from the keybed 92 and be of different heights in order to cause the keys for the letters to thus be at different heights. The rows 36, 38, 40 and 42 are thus arranged so that they extend upwards from the concentric 12 in the radial direction 26 away from the concentric 12 to result in upper surfaces of the keys of the letters being in a concave bowl-like shape. The rows 36, 38, 40 and 42, may be arranged completely around the concentric 12 so that a bowl shape is realized instead of simply a concave shape. This height variance may provide for increased tactile sensation and key strike efficiency of the user and may accommodate a wide range of thumb sizes. The concave bowl shape may provide for more efficient striking of the keys by the user as the keys may be more quickly struck with less errors being made by striking adjacent keys. Further, the groupings of letters and their arrangements may result in faster and more efficient entry of text during use of the text entry device 10.

Figure 35:
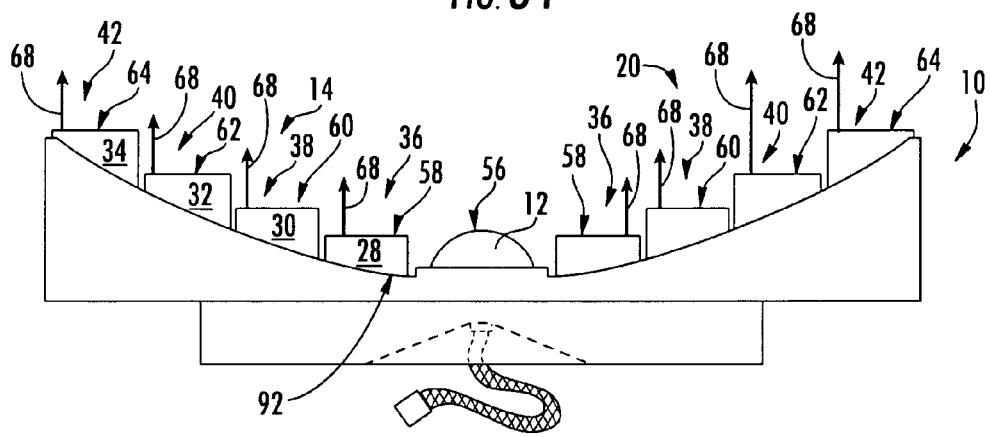
FIG. 35 is a side view of a text entry device with keys that have flat upper surfaces with groupings arranged in a concave shape.

An alternative exemplary embodiment is shown in FIG. 35 in which the upper surface 56 is higher than the upper surfaces 58. The upper surfaces 58, 60, 62 and 64 are flat with surface normals 68 that extend vertically with no horizontal component. The upper surfaces 60 are higher than upper surfaces 58 and upper surface 56. The upper surfaces 62 are higher than upper surfaces 60, and upper surfaces 64 are higher than upper surfaces 62. As shown, the keybed 92 is convex and bowl shaped so that the upper surfaces 58, 60, 62 and 64 extend generally the same amount from the keybed 92. However, the elevation (height) of the upper surfaces 58, 60, 62 and 64 may be measured by their distance from the upper surface 56 of the concentric 12, or may be measured by their distance with respect to the thumb of the user when resting on the upper surface 56, or may be measured by their vertical elevation towards or away from the user of the text entry device 10. The upper surface 56 may be at the lowest point with respect to any of the other keys in accordance with certain exemplary embodiments. In other embodiments, the outermost row is located at the highest elevation. Although shown as having upper surfaces 58, 60, 62 and 64 at different heights, it is to be understood that other arrangements are possible in which some of the upper surfaces 58, 60, 62 and 64 are located at the same height. As used herein, the elevation or height may be measured from the central location of the upper surfaces 58, 60, 62 and 64. In other arrangements, the height or elevation of the upper surfaces 58, 60, 62 and 64 may be measured from their outer edges.

Figure 36:
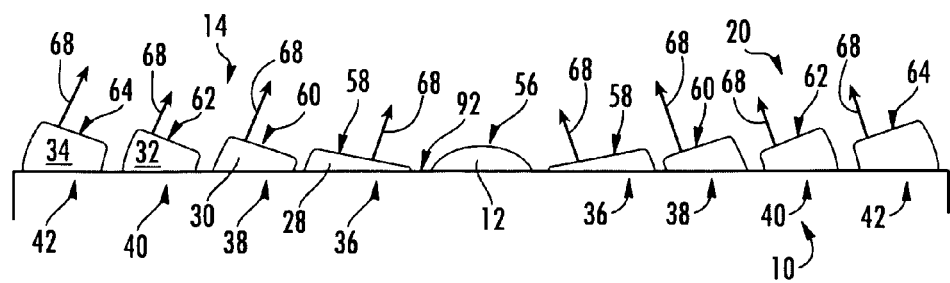
FIG. 36 is a side view of a text entry device with keys that have surface normals that are not parallel to a surface normal of a base of the keyboard.

FIG. 36 illustrates another alternative exemplary embodiment in which the keys are angled with respect to a keybed 92. The upper surfaces 58, 60, 62 and 64 have surface normals 68 that have a horizontal component and that point in the general direction towards the concentric 12 when viewed from above. Other arrangements are possible in which the surface normals 68 have a horizontal component that causes them to point away from the concentric 12 when viewed from above.

Figure 37:
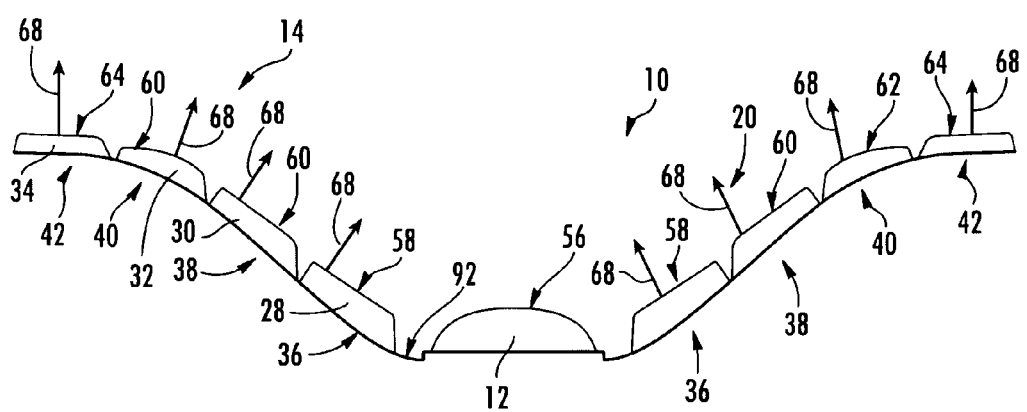
FIG. 37 is a side view of a text entry device with sides that ascend from the centric in a varying rate.

The text entry device 10 of FIG. 37 includes upper surfaces 64 that have surface normals 68 pointing vertically upwards with no horizontal component, while the surface normals 68 of the other upper surfaces 58, 60 and 62 have a horizontal component and point towards the concentric 12 when viewed from above. The elevation of the rows 36, 38, 40 and 42 is also varied such that the elevation becomes higher from rows 36 to 38 to 40 to 42. The rate of elevation increase is largest between row 36 and row 38. The rate of elevation increase is the least between row 40 and row 42 so that these rows 40 and 42 have elevations that are fairly close to one another. The elevation increase from row 38 to row 40 is intermediate such that the overall rate of elevation increase starts out sharply close to the concentric 12 and then tapers off along the radial direction 26 although it is not a consistent tapering from the concentric to the outer perimeter. The keybed 92 can be arranged in this elevation profile, or collars 54 can be employed as disclosed with other exemplary embodiments.

Figure 38:
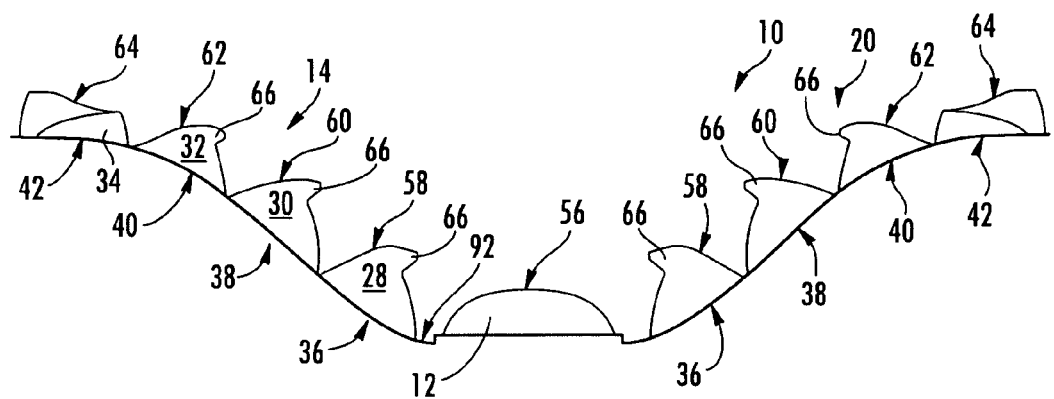
FIG. 38 is a side view of a text entry device with groupings that are arranged in a concave shape that ascend at varying rates and with keys that have tips.

FIG. 38 discloses an exemplary embodiment that is similar to that previously discussed with respect to FIG. 37. However, the upper surfaces 58, 60 and 62 are provided with tips 66 to aid the user in striking the keys. The raised tips 66 extend from the upper surfaces 58, 60 and 62 at the point of the upper surfaces 58, 60 and 62 closest to the concentric 12. The upper surfaces 64 may be provided with tips 66 in a similar manner in accordance with other exemplary embodiments.

Other exemplary embodiments may include raised, tactile bars that are located between adjacent groupings 14, 16, 18, 20, 22, 24 and 25 that are present in order to highlight the division between the groupings 14, 16, 18, 20, 22, 24 and 25 and to afford the user with a tactile dividing line when entering text without looking at the text entry device. The raised, tactile bars can be a single continuous bar or may be segmented. The raised tactile bars may be linear and extend from or be adjacent the concentric 12 or may be shaped so as to generally mimic the shape of the grouping 14, 16, 18, 20, 22, 24 and 25 to which it is associated. The raised tactile bars may be molded onto the bed the keys extend from or may be attached thereto.

Although described as being used in conjunction with a physical text entry device 10, the disclosed letter arrangements and other features may be incorporated into a soft keyboard or virtual keyboard in other exemplary embodiments. As such, it is to be understood that the text entry device 10 may be a soft keyboard or virtual keyboard and need not be a physical device in other embodiments. Text entry device 10 may be varied so as to include different languages such as English, Spanish, Latin, French, Italian, Portuguese and Romanian.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed:

1. A text entry device, comprising:
    a concentric;
    a first grouping of letters including the letters A, B, C and D, wherein the first grouping has at least three keys that are each located at a different radial distance from the concentric;
    a second grouping of letters including the letters E, F, G and H, wherein the second grouping has at least three keys that are each located at a different radial distance from the concentric;
    a third grouping of letters including the letters I, J, K and L, wherein the third grouping has at least three keys that are each located at a different radial distance from the concentric; and
    a fourth grouping of letters including the letters O, M, N and P, wherein the fourth grouping has at least three keys that are each located at a different radial distance from the concentric.

2. The text entry device as set forth in claim 1, wherein the first grouping, the second grouping, the third grouping, and the fourth grouping extend linearly from the concentric, and wherein the first grouping, the second grouping, the third grouping and the fourth grouping are all oriented at different angular positions about the concentric.

3. The text entry device as set forth in claim 1, further comprising:
    a fifth grouping of letters including the letters U, Q, R and S, wherein the fifth grouping has at least three keys that are each located at a different radial distance from the concentric; and
    a sixth grouping of letters including the letters T and V, wherein the sixth grouping has at least two keys that are each located at a different radial distance from the concentric;
    wherein the letter A of the first grouping is on the key of the first grouping that is closest to the concentric;
    wherein the letter E of the second grouping is on the key of the second grouping that is closest to the concentric;
    wherein the letter I of the third grouping is on the key of the third grouping that is closest to the concentric;
    wherein the letter O of the fourth grouping is on the key of the fourth grouping that is closest to the concentric;
    wherein the letter U of the fifth grouping is on the key of the fifth grouping that is closest to the concentric;
    wherein the letter T of the sixth grouping is on the key of the sixth grouping that is closest to the concentric.

4. The text entry device as set forth in claim 1, wherein the second closest key of the first grouping to the concentric and the second closest key of the second grouping to concentric each include a single letter that are consonants and that are not next in sequence to one another in the alphabet;
    wherein the second closest key of the second grouping to the concentric and the second closest key of the third grouping to the concentric each include a single letter that are consonants and that are not next in sequence to one another in the alphabet;
    wherein the second closest key of the third grouping to the concentric and the second closest key of the fourth grouping to the concentric each include a single letter that are consonants and that are not next in sequence to one another in the alphabet.

5. The text entry device as set forth in claim 1, wherein the text entry device is a soft keypad.

6. The text entry device as set forth in claim 1, wherein at least some of the keys are shaped and sized differently than other ones of the keys, and wherein the keys are sized and shaped to match the thumb print of the user upon using the concentric as an initial starting point of the thumb of the user.

7. The text entry device as set forth in claim 1, wherein color is used to distinguish the first grouping from the second grouping, wherein color is used to distinguish the second grouping from the third grouping, and wherein color is used to distinguish the third grouping from the fourth grouping.

8. The text entry device as set forth in claim 7, wherein primary colors and secondary colors are used to distinguish the groupings such that groupings immediately adjacent one another at different angular positions alternate between groupings that have primary colors and groupings that have secondary colors such that a grouping that has a primary color has groupings that have secondary colors on opposite sides at immediate angular positions.

9. The text entry device as set forth in claim 1, further comprising a color weave that is used to distinguish keys having the letters A, E, I, O, D, H, L, and N from keys having the letters B, C, F, G, J, K, and M.

10. A text entry device, comprising:
    a concentric about which all of the letters of the alphabet are disposed, wherein the letters are located on keys capable of being actuated by a user;
    a first grouping of letters including the letters A, B, C and D;
    a second grouping of letters including the letters E, F, G and H;
    a third grouping of letters including the letters I, J, K and L; and
    a fourth grouping of letters including the letters O, M, N and P;
    wherein the letters are disposed about the concentric such that a first row of keys are present that are immediately adjacent the concentric, wherein one of the letters of the first row of keys is a consonant.

11. The text entry device as set forth in claim 10, wherein a single key is present with the first grouping such that the letters A, B, C and D are included on a single key;
    wherein a single key is present with the second grouping such that the letters E, F, G and H are included on a single key;
    wherein a single key is present with the third grouping such that the letters I, J, K and L are included on a single key;
    wherein a single key is present with the fourth grouping such that the letters O, M, N and P are included on a single key;
    wherein the first grouping, the second grouping, the third grouping and the fourth grouping include only the first row of keys and not an additional row of keys.

12. The text entry device as set forth in claim 10, wherein at least two letters of the first grouping are included on a single key such that the single key is a multi-tap key.

13. The text entry device as set forth in claim 10, wherein the letters are disposed about the concentric such that a plurality of rows of keys are present that are each located a different radial distance from one another, wherein the row of keys that is the farthest distance from the concentric includes the letters A, E, I and O.

14. The text entry device as set forth in claim 10, further comprising:
a fifth grouping of letters including the letters U, Q, R and S;
a sixth grouping of letters including the letters T, V, W and X, wherein the letter T is on a key that is in the first row of keys.

15. A text entry device, comprising:
a concentric about which all of the letters of the alphabet are disposed, wherein the letters are located on keys capable of being actuated by a user;
a first row of keys that are immediately adjacent the concentric, wherein the first row of keys extend along an arc length about the concentric, wherein the first row of keys includes a key that is a double tap assignment key with the letters A and B; and
a second row of keys that are immediately adjacent the first row of keys and are located at a farther radial distance from the concentric than the first row of keys, wherein the second row of keys extend along an arc length about the concentric;
wherein the upper surfaces of the second row of keys are located at a higher elevation than the upper surfaces of the first row of keys.

16. A text entry device, comprising:
a concentric about which all of the letters of the alphabet are disposed, wherein the letters are located on keys capable of being actuated by a user;
a first row of keys that are immediately adjacent the concentric, wherein the first row of keys extend along an arc length about the concentric; and
a second row of keys that are immediately adjacent the first row of keys and are located at a farther radial distance from the concentric than the first row of keys, wherein the second row of keys extend along an arc length about the concentric;
wherein the upper surfaces of the second row of keys are located at a higher elevation than the upper surfaces of the first row of keys; and
a third row of keys that are immediately adjacent the second row of keys and are located at a farther radial distance from the concentric than the second row of keys, wherein the third row of keys extend along an arc length about the concentric, wherein the upper surfaces of the third row of keys are located at a higher elevation than the upper surfaces of the second row of keys.

17. The text entry device as set forth in claim 16, further comprising a fourth row of keys that are immediately adjacent the third row of keys and are located at a farther radial distance from the concentric than the third row of keys, wherein the fourth row of keys extend along an arc length about the concentric, wherein the upper surfaces of the fourth row of keys are located at a higher elevation than the upper surfaces of the third row of keys; and
wherein the concentric includes a key that has an upper surface that is located at a lower elevation than the upper surfaces of the first row of keys;
wherein the upper surfaces of the first row of keys, second row of keys, third row of keys, fourth row of keys, and the upper surface of the key of the concentric are arranged in a concave bowl shape.

18. A text entry device, comprising:
a concentric about which all of the letters of the alphabet are disposed, wherein the letters are located on keys capable of being actuated by a user;
a first row of keys that are immediately adjacent the concentric, wherein the first row of keys extend along an arc length about the concentric; and
a second row of keys that are immediately adjacent the first row of keys and are located at a farther radial distance from the concentric than the first row of keys, wherein the second row of keys extend along an arc length about the concentric;
wherein the upper surfaces of the second row of keys are located at a higher elevation than the upper surfaces of the first row of keys;
wherein at least some of the upper surfaces of the first row of keys and wherein at least some of the upper surfaces of the second row of keys have tips that aid in the striking of the keys by the user.

19. A text entry device, comprising:
a concentric about which all of the letters of the alphabet are disposed, wherein the letters are located on keys capable of being actuated by a user;
a first row of keys that are immediately adjacent the concentric, wherein the first row of keys extend along an arc length about the concentric; and
a second row of keys that are immediately adjacent the first row of keys and are located at a farther radial distance from the concentric than the first row of keys, wherein the second row of keys extend along an arc length about the concentric;
wherein the upper surfaces of the second row of keys are located at a higher elevation than the upper surfaces of the first row of keys;
wherein the upper surfaces of the first row of keys and the upper surfaces of the second row of keys are parallel to one another and have surface normals that extend vertically upwards without a horizontal component.

20. A text entry device, comprising:
a concentric about which all of the letters of the alphabet are disposed, wherein the letters are located on keys capable of being actuated by a user;
a first row of keys that are immediately adjacent the concentric, wherein the first row of keys extend along an arc length about the concentric; and
a second row of keys that are immediately adjacent the first row of keys and are located at a farther radial distance from the concentric than the first row of keys, wherein the second row of keys extend along an arc length about the concentric;
wherein the upper surfaces of the second row of keys are located at a higher elevation than the upper surfaces of the first row of keys;
wherein the upper surfaces of the first row of keys and the upper surfaces of the second row of keys are inclined such that they have surface normals that extend vertically upwards and have a horizontal component.

* * * * *